United States Patent
Cho et al.

(10) Patent No.: US 10,825,698 B2
(45) Date of Patent: Nov. 3, 2020

(54) SUBSTRATE DRYING APPARATUS, FACILITY OF MANUFACTURING SEMICONDUCTOR DEVICE, AND METHOD OF DRYING SUBSTRATE

(71) Applicant: Samsung Electronics Co., Ltd., Suwon-si (KR)

(72) Inventors: Yong-Jhin Cho, Hwaseong-si (KR); Young-Hoo Kim, Yongin-si (KR); Jihoon Jeong, Suwon-si (KR); Yungjun Kim, Seoul (KR); Kuntack Lee, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 212 days.

(21) Appl. No.: 15/845,236

(22) Filed: Dec. 18, 2017

(65) Prior Publication Data

US 2018/0366348 A1 Dec. 20, 2018

(30) Foreign Application Priority Data

Jun. 15, 2017 (KR) .................. 10-2017-0076030
Oct. 23, 2017 (KR) .................. 10-2017-0137427

(51) Int. Cl.
*H01L 21/67* (2006.01)
*B08B 3/08* (2006.01)
(Continued)

(52) U.S. Cl.
CPC .......... *H01L 21/67034* (2013.01); *B08B 3/08* (2013.01); *F26B 3/00* (2013.01);
(Continued)

(58) Field of Classification Search
CPC ......... H01L 21/67034; H01L 21/02101; H01L 21/67109; H01L 21/67051;
(Continued)

(56) References Cited

U.S. PATENT DOCUMENTS

| | | | |
|---|---|---|---|
| 5,795,691 A * | 8/1998 | Yamazaki | G03G 9/107 430/108.8 |
| 6,368,183 B1 * | 4/2002 | Trojan | H01L 21/67046 134/902 |
| 6,782,900 B2 | 8/2004 | DeYoung et al. | |
| 7,339,832 B2 | 3/2008 | Lambrache | |

(Continued)

FOREIGN PATENT DOCUMENTS

| | | |
|---|---|---|
| JP | 2005-503019 | 1/2005 |
| JP | 3699962 | 9/2005 |

(Continued)

*Primary Examiner* — Jessica Yuen
(74) *Attorney, Agent, or Firm* — Myers Bigel, P.A.

(57) ABSTRACT

Disclosed are a substrate drying apparatus, a facility of manufacturing a semiconductor device, and a method of drying a substrate. The substrate drying apparatus includes a chamber that is configured to dry a substrate at a first temperature, a first reservoir that is configured to store a first supercritical fluid at a second temperature that is less than the first temperature, a second reservoir that is configured to store a second supercritical fluid at a third temperature that is greater than the first temperature, and a supply unit connected between the chamber and the first reservoir and/or second reservoir. The supply unit is configured to supply the chamber with the first supercritical fluid and second supercritical fluid.

18 Claims, 18 Drawing Sheets

(51) Int. Cl.
  *H01L 21/02*  (2006.01)
  *F26B 3/00*  (2006.01)
  *F26B 5/00*  (2006.01)

(52) U.S. Cl.
  CPC ........ *F26B 5/005* (2013.01); *H01L 21/02057* (2013.01); *H01L 21/02101* (2013.01); *H01L 21/67051* (2013.01); *H01L 21/67109* (2013.01); *H01L 21/67173* (2013.01); *H01L 21/67248* (2013.01); *B08B 2203/007* (2013.01); *H01L 21/6704* (2013.01); *H01L 21/67219* (2013.01)

(58) Field of Classification Search
  CPC ......... H01L 21/67248; H01L 21/02057; H01L 21/67173; H01L 21/6704; H01L 21/67219; F26B 5/005; F26B 3/00; B08B 3/08; B08B 2203/007
  See application file for complete search history.

(56) References Cited

U.S. PATENT DOCUMENTS

| | | | |
|---|---|---|---|
| 7,507,297 | B2 | 3/2009 | Irie et al. |
| 9,691,638 | B2 | 6/2017 | Choi et al. |
| 2012/0048304 | A1* | 3/2012 | Kitajima ........... H01L 21/02101 134/30 |
| 2012/0228233 | A1 | 9/2012 | Terashima et al. |
| 2016/0334162 | A1 | 11/2016 | Kim et al. |
| 2017/0014731 | A1 | 1/2017 | Chess |

FOREIGN PATENT DOCUMENTS

| | | |
|---|---|---|
| JP | 2008-016669 | 1/2008 |
| JP | 2008-311231 | 12/2008 |
| JP | 2013-222947 | 10/2013 |
| JP | 5458314 | 4/2014 |
| KR | 10-2008-0077216 | 8/2008 |
| KR | 10-1548645 | 8/2015 |
| KR | 10-1605082 | 3/2016 |

\* cited by examiner

SUBSTRATE DRYING APPARATUS, FACILITY OF MANUFACTURING SEMICONDUCTOR DEVICE, AND METHOD OF DRYING SUBSTRATE

CROSS-REFERENCE TO RELATED APPLICATIONS

This U.S. non-provisional patent application claims priority under 35 U.S.C § 119 to Korean Patent Application No. 10-2017-0076030, filed on Jun. 15, 2017, in the Korean Intellectual Property Office, and to Korean Patent Application No. 10-2017-0137427, filed on Oct. 23, 2017, in the Korean Intellectual Property Office, the disclosures of which are hereby incorporated in their entirety by reference.

BACKGROUND

The present inventive concepts relate to substrate treatment, and more particularly, to a substrate drying apparatus, a facility of manufacturing a semiconductor device, and/or a method of drying a substrate.

Semiconductor devices are manufactured through various processes including a photolithography process for forming electric circuit patterns on a substrate such as a silicon wafer or the like. When semiconductor devices are manufactured, various foreign substances such as particles, organic contaminants, and/or metallic impurities are generated. These foreign substances may cause substrate defects to directly exert a bad influence on the yield of semiconductor devices. Thus, a cleaning process for removing the foreign substances may be involved in semiconductor manufacturing processes.

In general, in a typical cleaning process, foreign substances remaining on a substrate are removed using detergent and then the substrate is rinsed using deionized water (DI water) and dried using isopropyl alcohol (IPA). However, the drying process may have low efficiency in cases with a semiconductor substrate that has fine circuit patterns. In addition, since damage of the circuit patterns, i.e., pattern collapse, frequently occur during the drying process, the drying process is unsuitable for a semiconductor device having a line width of less than about 30 nm.

Therefore, to solve the above described limitation, there has been active studies about technologies for drying a substrate using supercritical fluids.

SUMMARY

Some embodiments of the present inventive concepts provide a substrate drying apparatus for reducing substrate drying time.

Some embodiments of the present inventive concepts provide a substrate drying apparatus for decreasing particle generation.

Objects of the present inventive concepts are not limited to the above-mentioned ones, and other effects, which are not mentioned above, will be apparently understood by one skilled in the art from the foregoing description and accompanying drawings.

According to some embodiments of the present inventive concepts, a substrate drying apparatus may include a chamber configured to dry a substrate at a first temperature, a first reservoir configured to store a first supercritical fluid having a second temperature that is less than the first temperature, a second reservoir configured to store a second supercritical fluid having a third temperature that is greater than the first temperature, and a supply unit connected between the chamber and the first reservoir and/or second reservoir, the supply unit being configured to supply the chamber with the first supercritical fluid and/or the second supercritical fluid.

According to some embodiments of the present inventive concepts, a facility of manufacturing a semiconductor device may include a substrate polishing apparatus that is configured to polish a substrate, a substrate cleaning apparatus that is configured to clean the substrate, and a substrate drying apparatus that is configured to dry the substrate. The substrate drying apparatus may include a chamber that is configured to dry the substrate at a first temperature, a first reservoir that is configured to store a first supercritical fluid at a second temperature that is less than the first temperature, a second reservoir that is configured to store a second supercritical fluid at a third temperature that is greater than the first temperature, and a supply unit that is connected between the chamber and the first reservoir and/or the second reservoir and is configured to provide the chamber with the first supercritical fluid and/or the second supercritical fluid.

According to some embodiments of the present inventive concepts, a method of drying a substrate may include heating a substrate in a chamber to a first temperature, providing a first supercritical fluid at a second temperature that is less than the first temperature, on the substrate, and providing with a second supercritical fluid at a third temperature that is greater than the first temperature, on the substrate.

DETAILED DESCRIPTION OF EMBODIMENTS

Figure 1:
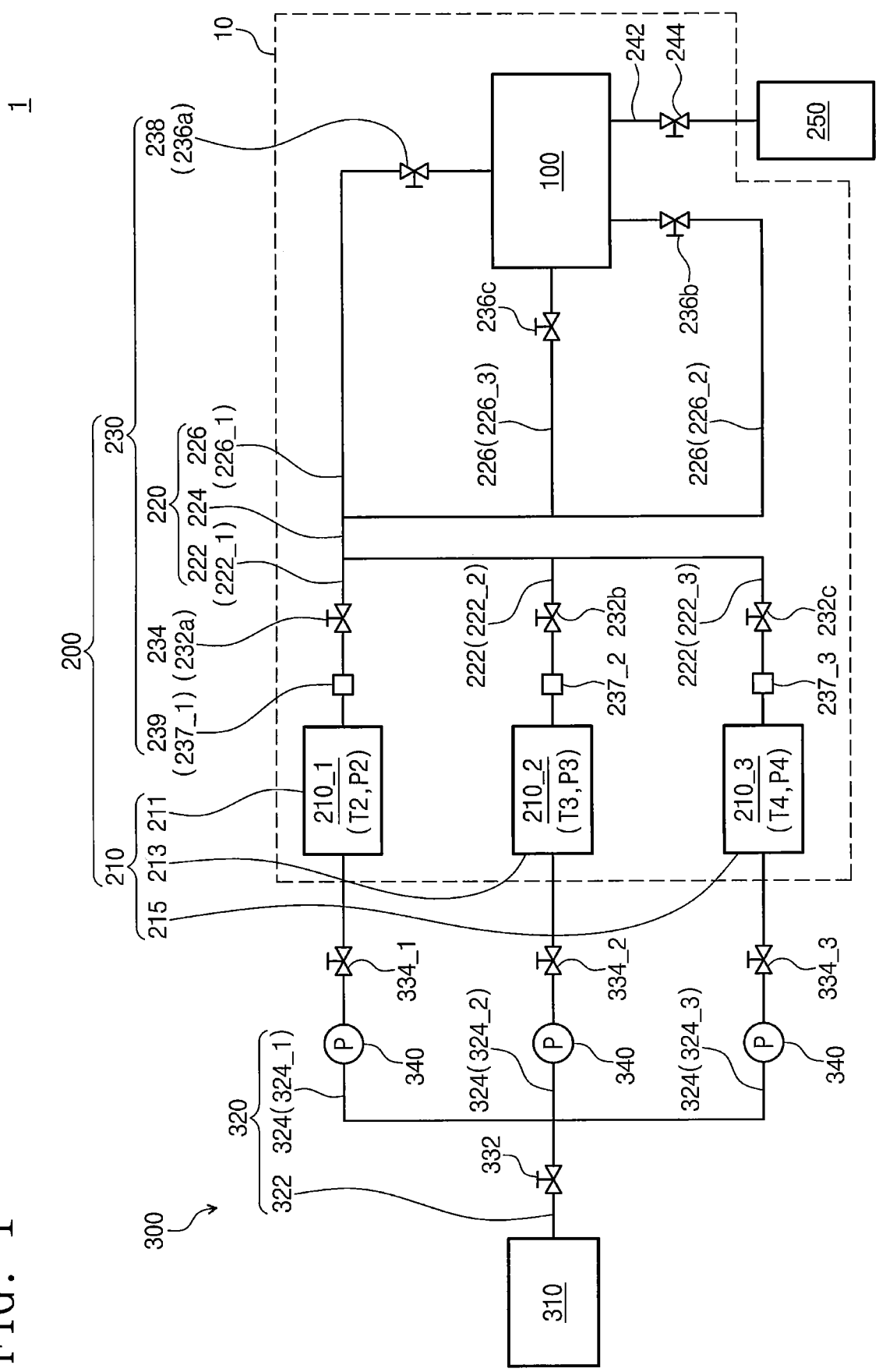
FIG. 1 illustrates a schematic diagram showing a substrate drying apparatus according to some embodiments of the present inventive concepts.

FIG. 1 illustrates a schematic diagram showing a substrate drying apparatus 1 according to some embodiments of the present inventive concepts.

Referring to FIG. 1, the substrate drying apparatus 1 may be a supercritical drying apparatus. In some embodiments, the substrate drying apparatus 1 may use a supercritical fluid to dry a cleaning solution on a substrate (see S of FIG. 3). As described herein, the term "supercritical fluid" may include a process fluid in a supercritical state. The term "supercritical state" may denote that a material reaches a critical state in which its temperature and/or pressure are equal to or greater than the critical point, and thus there may not be a distinction between the gaseous and liquid phases. A material in the supercritical state, referred to hereinafter as a supercritical material, may have a molecular density similar to that of a liquid and have viscosity similar to that of a gas. Due to its extremely high diffusion, penetration, and/or dissolution, the supercritical material may have an advantage during a chemical reaction. In addition, since the supercritical material may have an extremely low surface tension that is not sufficient enough to exert an interface tension on a fine structure, the supercritical material may prevent pattern collapse and watermark and/or have a superior dry efficiency, thereby being useful for drying semiconductor devices.

In some embodiments, the substrate drying apparatus 1 may include a process chamber 100, a supercritical fluid supply unit 200, and/or a source fluid supply unit 300.

The process chamber 100 may perform a substrate drying process in which a supercritical fluid is used. For example, the process chamber 100 may provide an inner space where the drying process is performed and whose rigidity and airtightness are sufficient enough to allow the supercritical fluid to enter its supercritical state. The process chamber 100 may be a high-pressure chamber. The supercritical process performed in the process chamber 100 may include various unit processes for manufacturing semiconductor devices. The various unit processes may include, for example, an etching process in which the supercritical fluid is used as an etchant, a cleaning process in which the supercritical fluid is used to clean a substrate that has experienced an etching process, and/or a drying process in which the supercritical fluid is used to dry a substrate that has experienced an etching process. The process chamber 100 may thus be provided with a supercritical fluid that becomes different based on a type of the supercritical process. The supercritical process will be explained hereinafter as the drying process. The process chamber 100 may be heated to above room temperature. When isopropyl alcohol (IPA) is employed to dry the substrate, the process chamber 100 may be heated to less than an evaporation point (e.g. 82.5° C.) of the isopropyl alcohol. For example, the process chamber 100 may heat the substrate to a first temperature T1 of about 40° C. to about 80° C. A first pressure of the process chamber 100 may be changed.

For example, when the process chamber 100 is loaded with a substrate S that includes thereon a fine pattern structure with a high aspect ratio of 10 to 50 that has experienced a cleaning process in which a cleaning solution such as an organic chemical is used, a drying process using the supercritical fluid may be performed in the process chamber 100. The supercritical drying process may thus effectively remove the cleaning solution, while preventing damage to the pattern structure. The drying process may treat a substrate without damage to high-aspect ratio patterns by replacing solvents with supercritical fluids containing an additive such as a surfactant.

The supercritical fluid may be a fluid at or above its critical temperature and pressure, and may have gaseous properties (e.g., diffusivity, viscosity, and surface tension) and liquid properties (e.g., solubility). Therefore, the solvent replacement under a supercritical state may easily remove impurities from the high-aspect ratio patterns. For example, an organic chemical used in the cleaning process may include ethyl glycol, 1-propanol, tetra hydraulic franc, 4-hydroxyl, 4-methyl, 2-pentanone, 1-butanol, 2-butanol, methanol, ethanol, n-propyl alcohol, dimethylether, or a combination thereof. The process fluid that removes the organic chemical under a supercritical state may include carbon dioxide ($CO_2$), water ($H_2O$), methane ($CH_4$), ethane ($C_2H_6$), propane ($C_3H_8$), ethylene ($C_2H_4$), propylene ($C_2H_2$), methanol ($C_2H_3OH$), ethanol ($C_2H_5OH$), sulfur hexafluoride ($SF_6$), acetone ($C_3H_8O$), or a combination thereof. Although some embodiments described hereinafter include carbon dioxide ($CO_2$) as the supercritical fluid for drying a substrate, but constituents and/or kinds of supercritical fluids are not limited thereto.

The supercritical fluid supply unit 200 may receive the source fluid from the source fluid supply unit 300, and may change the source fluid into the supercritical fluid that is introduced into the process chamber 100. For example, the supercritical fluid supply unit 200 may include a supercritical fluid reservoir 210 (211, 212, 213), by which the supercritical fluid is changed from the source fluid and in which the supercritical fluid is stored, and a supercritical fluid supply member 230, through which the supercritical fluid flows from the supercritical fluid supply reservoir 210 to the process chamber 100. The source fluid may include a process fluid in a gaseous or liquid state. The source fluid supplied to the supercritical fluid reservoir 210 may be pressurized and heated to or above its critical point, thereby being changed into the supercritical fluid. The changed supercritical fluid may be supplied from the supercritical fluid reservoir 210 to the process chamber 100 through a supercritical fluid supply line 220 which will be discussed below.

According to the present inventive concepts, the supercritical fluid reservoir 210 may be provided in plural, such as 211, 212, 213. The plurality of supercritical fluid reservoirs 210 may be connected in parallel to each other and may correspondingly store supercritical fluids in different process conditions from each other. For example, any one of the supercritical fluids stored in the plurality of supercritical fluid reservoirs 210 may have its temperature and pressure different from those of other ones of the supercritical fluids stored in the plurality of supercritical fluid reservoirs 210. In some embodiments, the supercritical fluids stored in the plurality of supercritical fluid reservoirs 210 may have different temperatures from each other, but may have the same pressure as each other. In the above examples, the supercritical fluids may be the same kind of process fluid, but embodiments of the present inventive concepts are not limited thereto.

In some embodiments, the plurality of supercritical fluid reservoirs 210 may include a first reservoir 211 that stores a first supercritical fluid 210_1 at a second temperature T2 and a second pressure P2, and a second reservoir 213 that stores a second supercritical fluid 210_2 at a third temperature T3 and a third pressure P3, and a third reservoir 215 that stores a third supercritical fluid 210_3 at a fourth temperature T4 and a fourth pressure P4. The second to fourth temperatures T2 to T4 may be the same or may be different from each other, while second to fourth pressures P2 to P4 may be the same or different from each other. The second temperature T2 may be less than the first temperature T1, and the third temperature T3 may be greater than the first temperature T1, and the fourth temperature T4 may be the same as the first temperature T1. For example, when the first supercritical fluid 210_1 includes carbon dioxide, the second temperature T2 may fall within a range from about 30° C. to about 39° C. (e.g., 31.1° C.), the third temperature T3 may fall within a range from about 100° C. to about 200° C., and the fourth temperature T4 may fall within a range from about 40° C. to about 80° C. Even if the supercritical fluid supply member 230 is separately equipped with a heating device, a heat transfer speed from the heating device to the first to third supercritical fluids 210_1 to 210_3 may have a limitation due to a high flow rate of the first to third supercritical fluids 210_1 to 210_3 flowing through a supercritical fluid supply line 220 which will be discussed below. Embodiments of the present inventive concepts, however, are not limited thereto. The second to fourth pressures P2 to P4 may fall within a range from about 80 bar to about 300 bar, and may be the same or different from each other. Although the present embodiment is illustrated to have three supercritical fluid reservoirs 210, the number of the supercritical fluid reservoirs 210 is not limited thereto. The present embodiment may be provided either with two supercritical fluid reservoirs 210 or with four or more supercritical fluid reservoirs 210. A detailed configuration of the supercritical fluid reservoir 210 will be further discussed again below.

The supercritical fluid supply member 230 may provide the process chamber 100 with the first supercritical fluid 210_1, the second supercritical fluid 210_2, and/or the third supercritical fluid 210_3. In some embodiments, the supercritical fluid supply member 230 may include a supercritical fluid supply line 220, front control valves 234, rear control valves 238, and/or filters 239.

The supercritical fluid supply line 220 may include front supply lines 222 correspondingly engaged with the plurality of supercritical fluid reservoirs 210, a connection line 224 coupled in common to the front supply lines 222, and rear supply lines 226 branched from the connection line 224 and individually engaged with the process chamber 100. For example, the front supply lines 222 may include a first front supply line 222_1 having an end connected to the first reservoir 211, a second front supply line 222_2 having an end connected to the second reservoir 213, and a third front supply line 222_3 having an end connected to the third reservoir 215.

The rear supply lines 226 may include a first rear supply line 226_1 connected to an upper side of the process chamber 100, a second rear supply line 226_2 connected to a lower side of the process chamber 100, and/or a third rear supply line 226_3 connected to a lateral side of the process chamber 100.

The front control valves 234 may include first, second, and/or third front control valves 232a, 232b, and/or 232c. The first to third front control valves 232a, 232b, and 232c may be respectively installed on the first to third front supply lines 222_1, 222_2, and/or 222_3. The first, second, and/or third front control valves 232a, 232b, and/or 232c may selectively open and close the first, second, and/or third front supply lines 222_1, 222_2, and/or 222_3, respectively. In addition, the first, second, and/or third front control valves 232a, 232b, and/or 232c may respectively control flow quantities of the first to third supercritical fluids 210_1, 210_2, and/or 210_3 flowing through the first, second, and/or third front supply lines 222_1, 222_2, and 222_3.

The rear control valves 238 may include first, second, and/or third rear control valves 236a, 236b, and/or 236c. The first, second, and/or third rear control valves 236a, 236b, and/or 236c may be respectively installed on the first, second, and/or third rear supply lines 226_1, 226_2, and/or 226_3. The first to third rear control valves 236a, 236b, and/or 236c may selectively open and close the first to third rear supply lines 226_1, 226_2, and/or 226_3, respectively. In addition, The first to third rear control valves 236a, 236b, and/or 236c may respectively open and close the first to third rear supply lines 226_1, 226_2, and 226_3 respectively control flow quantities of the first to third supercritical fluids 210_1, 210_2, and 210_3 flowing through the first to third rear supply lines 226_1, 226_2, and 226_3.

The filters 239 may be engaged with either the front supply lines 222 or the rear supply lines 226. The filters 239 may remove particles of the first to third supercritical fluids 210_1, 210_2, and/or 210_3. Each of the filters 239 may include a metal sintering filter. The filters 239 may remove particles whose size is in a range from about 10 nm to about 100 nm or more. In an embodiment, the filters 239 may include a first filter 237_1, a second filter 237_2, and/or a third filter 237_3. The first, second, and/or third filters 237_1, 237_2, and/or 237_3 may be respectively installed on the first, second, and/or third front supply lines 222_1, 222_2, and/or 222_3. In some embodiments, the first, second, and/or third filters 237_1, 237_2, and/or 237_3 may be respectively installed on the first, second, and/or third rear supply lines 226_1, 226_2, and/or 226_3.

Before the process chamber 100 is provided with the first to third supercritical fluids 210_1, 210_2, and 210_3, the process chamber 100 may be set to have an inner pressure less than a supercritical point, and as a result, the first to third supercritical fluids 210_1, 210_2, and 210_3 initially introduced into the process chamber 100 may be adiabatically expanded to change into condensed particles. The particles may act as defect sources to a substrate in the process chamber 100. Accordingly, when the first to third supercritical fluids 210_1, 210_2, and 210_3 are initially introduced, the process chamber 100 may be provided on its lower portion (e.g., on its region lower than a substrate) with the first to third supercritical fluids 210_1, 210_2, and 210_3 through the second rear supply line 226_2, When a pressure gradient between an inner pressure of the process chamber 100 and a supply pressure of the first to third supercritical fluids 201_1, 210_2, and 210_3 becomes reduced below an allowable range, the process chamber 100 may also be provided with the first to third supercritical fluids 210_1, 210_2, and 210_3 through either the first rear supply line 226_1 or the third rear supply line 226_3 as well as through the second rear supply line 226_2. Introduction of supercritical fluid through multiple supply lines may decrease a supply time of the first to third supercritical fluids 210_1, 210_2, and 210_3 into the process chamber 100.

In some embodiments, one or two of the first to third rear supply lines 226_1 to 226_3 may not be provided. For example, the third rear supply line 226_3 may not be provided. In some embodiments, the third rear supply line 226_3 and one of the first or second rear supply lines 226_1 or 226_2 may not be provided.

A controller 10 may control the process chamber 100 and the supercritical fluid supply unit 200. The controller 10 may control the opening and/or the closing of the first to third front control valves 232a, 232b, and/or 232c, and the first to third rear control valves 236a, 236b, and/or 236c.

Figure 2:
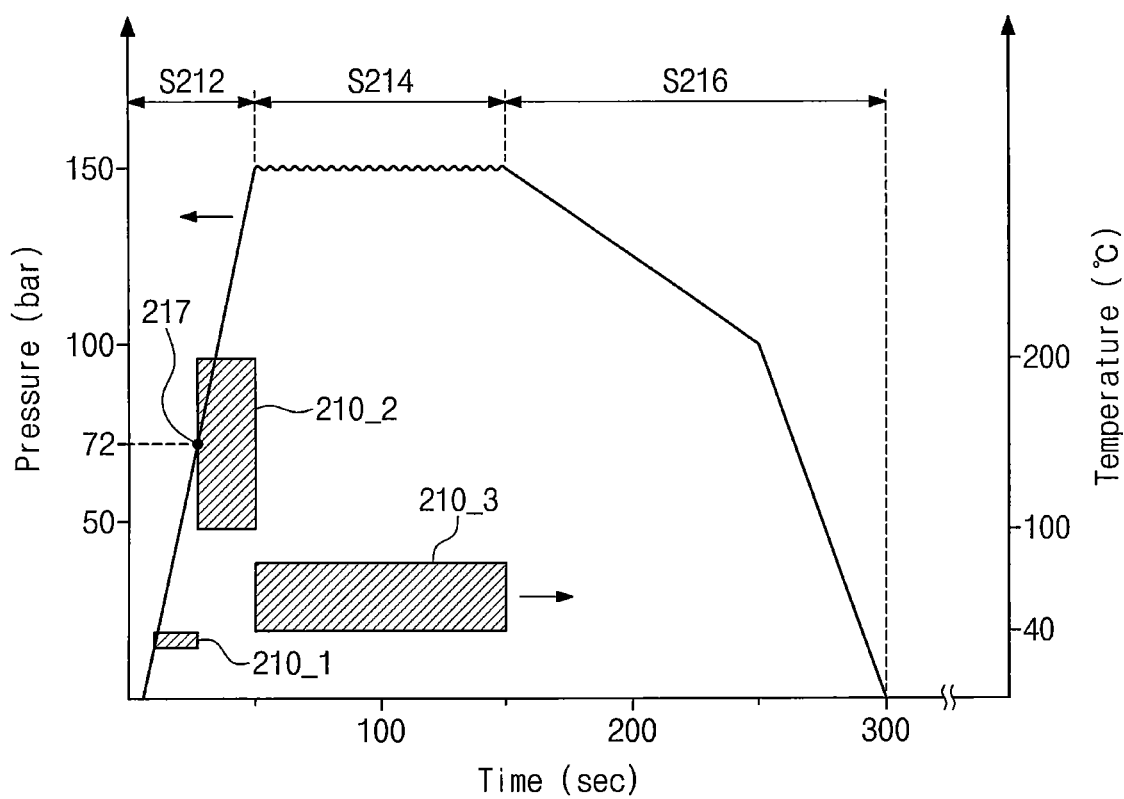
FIG. 2 illustrates a graph showing variations in pressure and temperature of a process chamber of FIG. 1.

FIG. 2 illustrates a graph showing variations in pressure and temperature of process chamber 100 of FIG. 1.

Referring to FIG. 2, the first to third supercritical fluids 210_1, 210_2, 210_3 may be sequentially supplied based on a pressure of the process chamber 100. The pressure of the process chamber 100 may have an ascending duration S212, a saturation duration S214, and a descending duration S216, depending on a drying process time.

For example, in the ascending duration S212, the supercritical fluid supply unit 200 may provide the process chamber 100 with the first and second supercritical fluids 210_1 and 210_2. The first supercritical fluid 210_1 may be introduced into the process chamber 100 at an initial stage of the substrate drying process. The first supercritical fluid 210_1 may have a density greater than those of the second and third supercritical fluids 210_2 and 210_3. The process chamber 100 may be filled with the first supercritical fluid 210_1 at a higher speed than when the process chamber 100 is subsequently filled with any of the second and third supercritical fluids 210_2 and 210_3. Thus, the drying time may be reduced.

When the pressure of the process chamber 100 reaches a critical point 217 of the first supercritical fluid 210_1, the supercritical fluid supply unit 200 may supply the process chamber 100 with the second supercritical fluid 210_2. The critical point 217 may be defined by a pressure at which the first supercritical fluid 210_1 changes from gaseous state to liquid state in the process chamber 100. The critical point 217 of the first supercritical fluid 210_1 may be, for example, about 72 bar.

The second supercritical fluid 210_2 may be supplied before the pressure of the process chamber 100 reaches the saturation duration S214. The pressure of the process chamber 100 may be maintained, for example, at about 150 bar during the saturation duration S214. The second supercritical fluid 210_2 may prevent particle generation in the process chamber 100. For example, when the first supercritical fluid 210_1 is heated in the process chamber 100, particles may be generated due to expansion of the first supercritical fluid 210_1. As the second supercritical fluid 210_2 is filtered by the second filter 237_2 to remove particles and subsequently be introduced into the process chamber 100, the particle generation may be minimized or reduced in the process chamber 100.

When the pressure of the process chamber 100 reaches the saturation duration S214, the supercritical fluid supply unit 200 may supply the process chamber 100 with the third supercritical fluid 210_3. The third supercritical fluid 210_3 may dissolve a cleaning solution and/or an organic solution on the substrate S, thereby drying the substrate S.

When the pressure of the process chamber 100 reaches the descending duration S216, the supercritical fluid supply unit 200 may stop the supply of the first to third supercritical fluids 210_1, 210_2, and/or 210_3. The first to third supercritical fluids 210_1, 210_2, and/or 210_3 may be discharged out of the process chamber 100.

When the drying process is performed, characteristics of the first to third supercritical fluids 210_1, 210_2, and 210_3 may be changed based on semiconductor manufacturing processes (e.g., minimum line widths, pattern densities, and/or aspect ratios of fine patterns formed on a substrate). Based on semiconductor manufacturing processes, the first to third supercritical fluids 210_1, 210_2, and 210_3 may be changed to prevent collapse of fine patterns formed on a substrate and/or to minimize occurrence of particles in the process chamber 100. To satisfy the characteristics of the first to third supercritical fluids 210_1, 210_2, and 210_3, the temperatures and/or pressures of the first to third supercritical fluids 210_1, 210_2, and 210_3 stored in the supercritical fluid reservoir 210 may be controlled. Temperatures of the first to third supercritical fluids 210_1, 210_2, and 210_3 introduced into the process chamber 100 may in particular have an effect on the particle generation, and thus it may be needed to control the temperatures of the first to third supercritical fluids 210_1, 210_2, and 210_3.

When the substrate drying apparatus 1 includes one supercritical fluid reservoir 210, it may be difficult to sufficiently create and provide the first to third supercritical fluids 210_1, 210_2, and 210_3 that satisfy supercritical characteristics required in each of semiconductor manufacturing processes. In particular, heating or cooling time may be consumed to control the temperatures of the first to third supercritical fluids 210_1, 210_2, and 210_3, and it may thus be difficult to provide the first to third supercritical fluids 210_1, 210_2, and 210_3 that satisfy a desired temperature condition in a short period of time. However, according to some embodiments of the present inventive concepts, the substrate drying apparatus 1 may include a plurality of supercritical fluid reservoirs 210 each of which stores a supercritical fluid at predetermined temperature and pressure conditions, so that the process chamber 100 may easily receive the first to third supercritical fluids 210_1, 210_2, and 210_3 that satisfy desired supercritical characteristics (e.g., required temperature and/or pressure). As described herein, enhanced process efficiency may be provided to the drying process using the substrate drying apparatus 1.

The source fluid supply unit 300 may provide the source fluid to the plurality of supercritical fluid reservoirs 210. For example, the source fluid supply unit 300 may include a source fluid reservoir 310 in which the source fluid is stored and a source fluid supply line 320 through which the source fluid flows to the supercritical fluid reservoirs 210.

The source fluid reservoir 310 may be provided in the form of a storage cylinder or a storage tank having therein an inner space in which the source fluid is stored. The source fluid may be supplied to the source fluid reservoir 310 from the outside. For example, the source fluid may be introduced through a separate line to the source fluid reservoir 310 (not shown). The source fluid reservoir 310 may store the source fluid in a liquid or gaseous state. The source fluid reservoir 310 may also be kept above a predetermined pressure to increase a quantity of the source fluid stored therein, thereby increasing a total quantity of the stored source fluid.

The source fluid supply line 320 may include a main line 322, which is connected to the source fluid reservoir 310, and source lines 324, which are branched from the main line 322 and correspondingly connected to the plurality of supercritical fluid reservoirs 210. For example, the source lines 324 may include a first source line 324_1 having an end connected to the first reservoir 211, a second source line 324_2 having an end connected to the second reservoir 213, and a third source line 324_3 having an end connected to the third reservoir 215. The main line 322 may be installed thereon with a main valve 332; and the first, second, and third source lines 324_1, 324_2, and 324_3 may be installed thereon with first, second, and third source valves 334_1, 334_2, and 334_3, respectively. The main valve 332 may control an open/close state of the main line 322 and a flow quantity of the source fluid flowing through the main line 322. The first to third source valves 334_1 to 334_3 may control operations (e.g., opens and closes) of the first to third source lines 324_1 to 324_3, respectively, and may control flow quantities of the source fluids flowing through the first to third source lines 324_1 to 324_3, respectively.

Pumps 340 may be correspondingly associated with the source lines 324. The source fluids flowing through the source lines 324 may be pressurized to or above their critical points by the pumps 340, and may then be introduced into the supercritical fluid reservoirs 210. For example, the pumps 340 may operate to allow the supercritical fluid reservoirs 210 to have inner pressures that are increased to or above critical points of the source fluids. When the source fluid is in a gaseous state, a condenser (not shown) may be installed on the main line 322 and/or each of the source lines 324. The condenser (not shown) may change the source fluid from its gaseous state to its liquid state, and may increase a flow quantity of the source fluid to be introduced into the supercritical fluid reservoirs 210. A source filter (not shown) may be optionally installed on the main line 322 and/or each of the source lines 324. The source filter (not shown) may remove impurities contained in the source fluid to be introduced into the source fluid reservoirs 310.

An exhaust line 242 may be coupled to the bottom side of the process chamber 100. The first to third supercritical fluids 210_1, 210_2, and 210_3 may be drained out of the process chamber 100 through the exhaust line 242. The first to third supercritical fluids 210_1, 210_2, and 210_3 may be exhausted through the exhaust line 242 to the atmosphere or to a collect tank 250. The exhaust line 242 may be provided thereon with an exhaust valve 244. The exhaust valve 244 may control an open/close state of the exhaust line 242 and a flow quantity of the first to third supercritical fluids 210_1, 210_2, and 210_3 flowing through the exhaust line 242.

Figure 3:
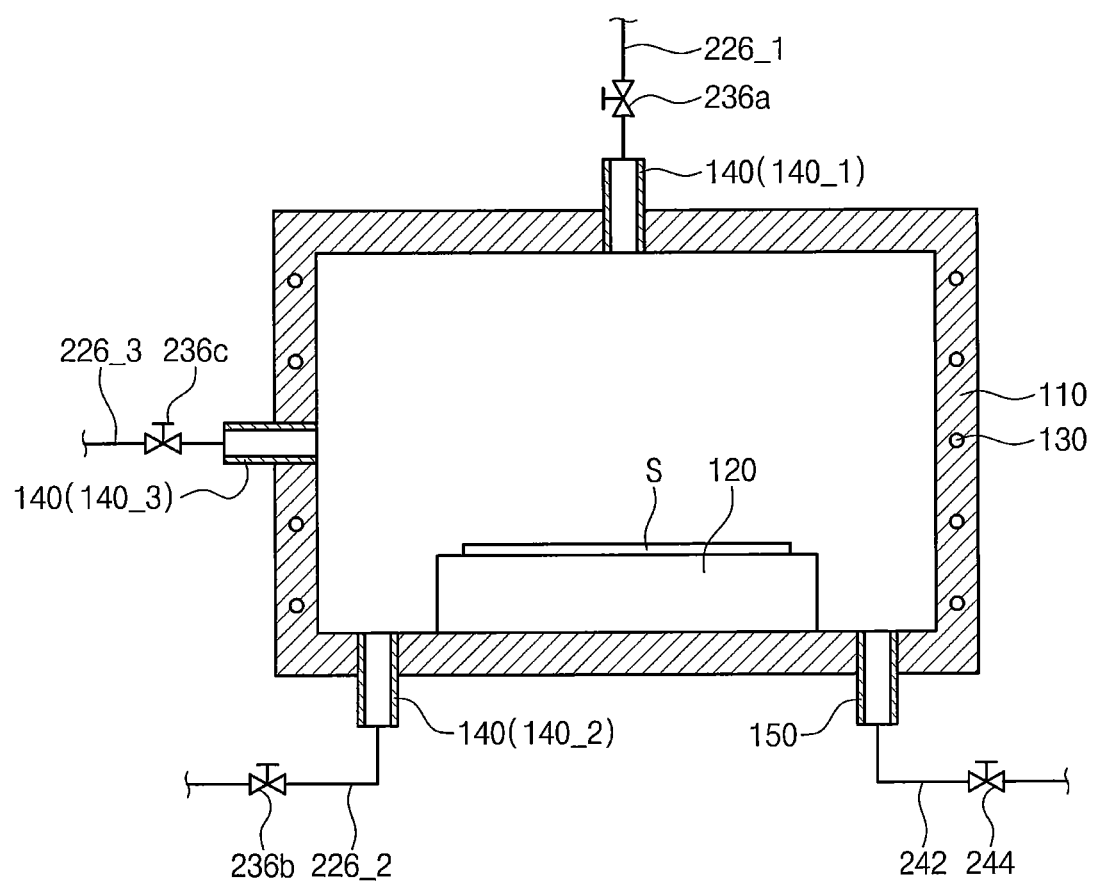
FIGS. 3 and 4 illustrate schematic diagrams showing the process chamber of FIG. 1.
Figure 4:
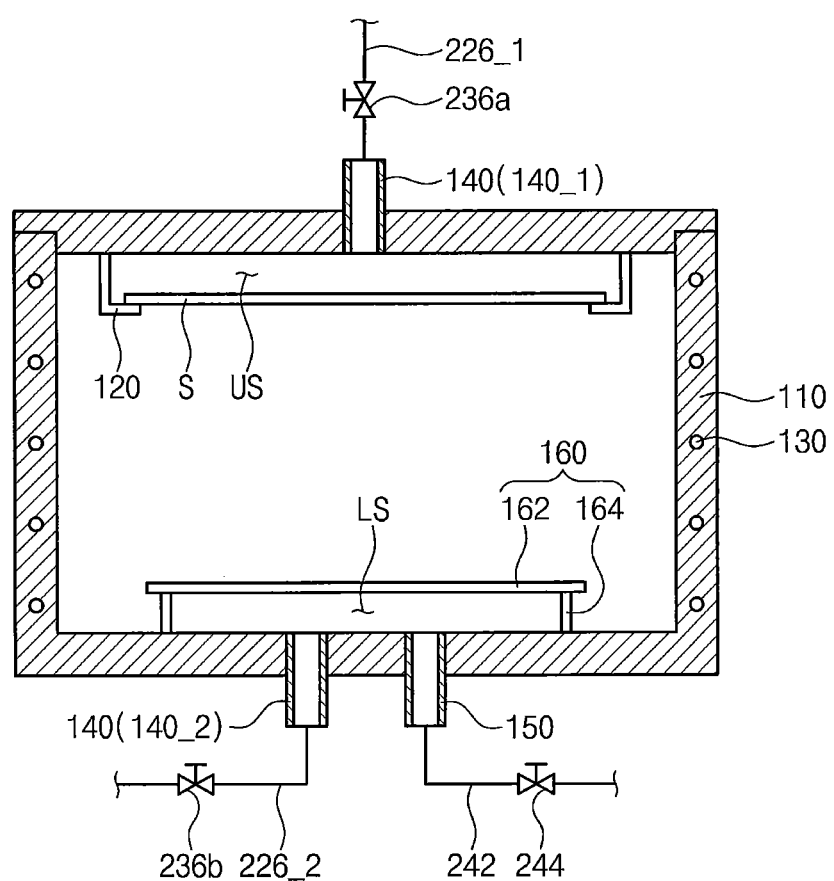

FIGS. 3 and 4 illustrate schematic diagrams showing the process chamber 100 of FIG. 1.

Referring to FIG. 3, the process chamber 100 may include a housing 110, a support member 120, a heating member 130, one or more supply ports 140, and an exhaust port 150.

The housing 110 may provide a space where the drying process is performed. When the drying process is performed, the housing 110 may be hermetically sealed from the external environment. The housing 110 may be constructed of a material that may endure a high pressure at or above a critical point.

The housing 110 may be provided therein with the support member 120 by which a substrate S is supported. In some embodiments, the support member 120 may be installed on a bottom wall of the housing 110. In some embodiments, the support member 120 may not be fixed, but may be provided in the form of a rotatable structure that rotates the substrate S placed thereon. Embodiments of the present inventive concepts, however, are not limited thereto. The support member 120 may be provided in various shape designed for supporting the substrate S.

The heating member 130 may heat an inside of the housing 110 so that the first to third supercritical fluids 210_1, 210_2, and 210_3 may be heated to or above their critical temperature to maintain their supercritical states, or may reheat the inside of the housing 110 when the first to third supercritical fluids 210_1, 210_2, and 210_3 are changed into liquid states. For example, the heating member 130 may heat the substrate S to the first temperature T1 of about 40° C. to about 80° C. The heating member 130 may be installed embedded in a lateral sidewall of the housing 110. For example, the heating member 130 may be provided as a heater that receives an external power to generate heat. The placement of the heating member 130 is not limited to the embodiments shown in the figures, but the heating member 130 may be placed in various positions.

The supply port 140 may provide the first to third supercritical fluids 210_1, 210_2, and 210_3 into the process chamber 100. The supply port 140 may be provided in single or plural engaged with the housing 110. For example, the supply port 140 may include an upper supply port 140_1 installed on a top sidewall of the housing 110, a lower supply port 140_2 installed on a bottom sidewall of the housing 110, and a lateral supply port 140_3 installed on a lateral sidewall of the housing 110. The upper, lower, and lateral supply ports 140_1, 140_2, and 140_3 may be respectively connected to the first, second, and third rear supply lines 226_1, 226_2, and 226_3. Optionally, one or more of the upper, lower, and lateral supply ports 140_1, 140_2, and 140_3 may not be provided. The process chamber 100 may further include a gas supply port (not shown) provided on the top sidewall of the housing 110. The gas supply port (not shown) may be connected to a gas supply line (not shown) to provide an inert gas into the housing 110. For example, the inert gas may include nitrogen ($N_2$), helium (He), or argon (Ar).

The exhaust port 150 may be provided on the bottom sidewall of the housing 110. The exhaust port 150 may be connected to the exhaust line 242 to exhaust the first to third supercritical fluids 210_1, 210_2, and 210_3 or the inert gas to the outside of the process chamber 100. For example, at the latter stage of the drying process, the first to third supercritical fluids 210_1, 210_2, and 210_3 may be exhausted from the process chamber 100, and the inner pressure of the process chamber 100 may become reduced below a critical pressure, which may liquefy the first to third supercritical fluids 210_1, 210_2, and 210_3. Gravity may cause the process chamber 100 to exhaust the liquefied supercritical fluid through the exhaust port 150 to the outside.

In some embodiments, the support member 120 may be installed on a top side of the housing 110. For example, referring to FIG. 4, the support member 120 may be provided to have a structure that vertically extends downward from a bottom surface of the top sidewall of the housing 110 and then perpendicularly bent in a horizontal direction. In this case, the process chamber 100 may further include a shield member 160. The shield member 160 may include a shield plate 162, which is disposed between the lower supply port 140_2 and the support member 120, and supporters 164, which are installed on the bottom sidewall of the housing 110 and which support the shield plate 162. The shield plate 162 may block the substrate S from directly receiving the first to third supercritical fluids 210_1, 210_2, and 210_3 introduced through the lower supply port 140_2. The supporters 164 may be spaced and disposed along a circumference of the shield plate 162 to provide flow passages to the first to third supercritical fluids 210_1, 210_2, and/or 210_3.

The support member 120 and the shield member 160 may define an upper space US and a lower space LS inside the process chamber 100. The upper and lower spaces US and LS may be spatially connected to each other. At the initial stage of supplying the first to third supercritical fluids 210_1, 210_2, and 210_3, the first to third supercritical fluids 210_1, 210_2, and 210_3 may be introduced through the lower supply port 140_2 into the lower space LS of the process chamber 100. When a process gradient between an inner pressure of the process chamber 100 and a supply pressure of the first to third supercritical fluids 210_1, 210_2, and 210_3 becomes sufficiently reduced, the supercritical fluid may be directly introduced through the upper supply port 140_1 into the upper space US. In some embodiments, the exhaust port 150 may be placed below the shield plate 162. The lateral supply port 140_3 may not be provided, but embodiments of the present inventive concepts are not limited thereto.

Figure 5:
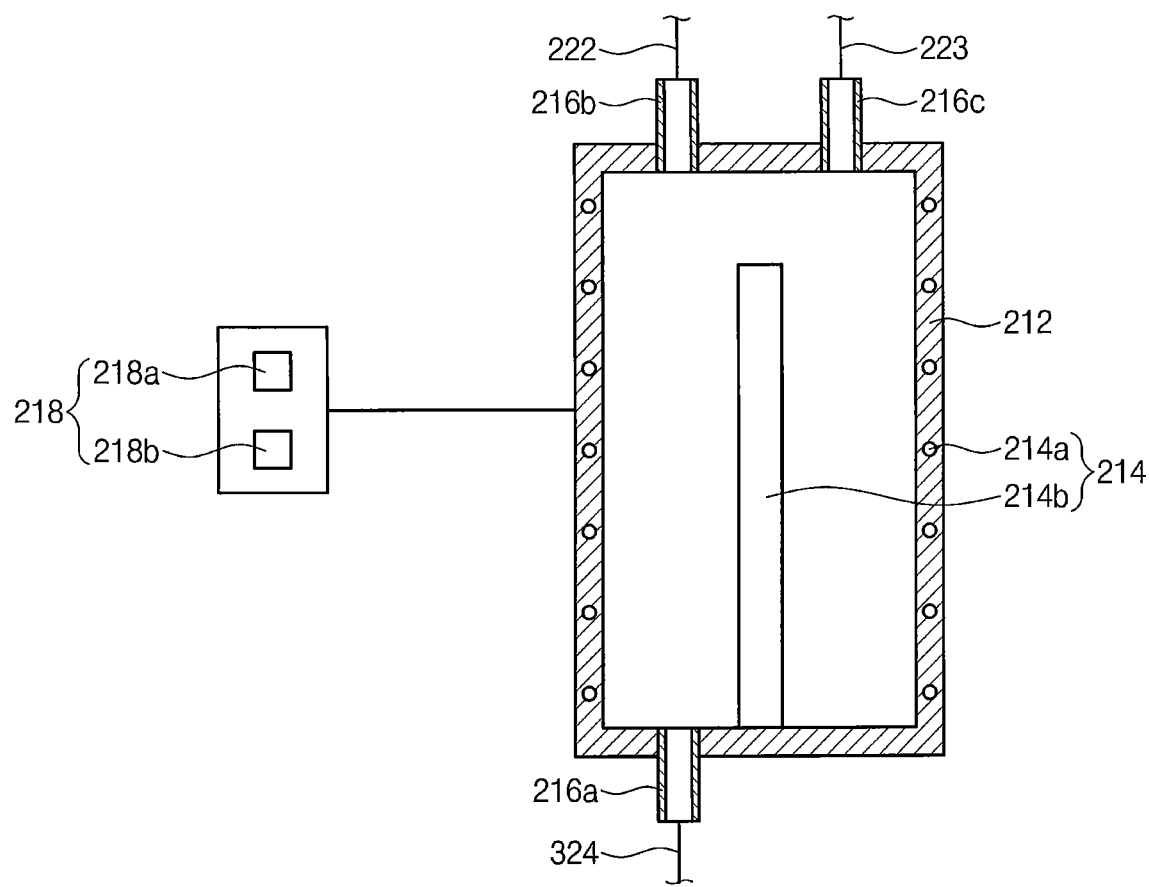
FIG. 5 illustrates a schematic diagram showing the supercritical fluid reservoir of FIG. 1.

FIG. 5 illustrates a schematic diagram showing the supercritical fluid reservoir of FIG. 1.

Referring to FIG. 5, the supercritical fluid reservoir 210 may include a supercritical storage tank 212, a heater 214, and a detection sensor 218.

The supercritical storage tank 212 may provide an inner space that stores the process fluid (e.g., the source fluid or the first to third supercritical fluids 210_1, 210_2, and 210_3). The supercritical storage tank 212 may be provided in the form of a shape that may endure a pressure variation of the inner space thereof. For example, the supercritical storage tank 212 may be provided in the form of a cylindrical or spherical shape. In addition, the supercritical storage tank 212 may consist of stainless steel that may endure an inner pressure ranging from about 80 bar to about 300 bar at a temperature ranging from about 30° C. to about 300° C.

The supercritical storage tank 212 may be provided with a first connection port 216a coupled to the source line 324 and a second connection port 216b coupled to the front supply line 222. Considering that the process fluid flows in the inner space of the supercritical storage tank 212, the first and second connection ports 216a and 216b may be provided at appropriate positions on the supercritical storage tank 212. For example, the first and second connection ports 216a and 216b may be connected to facing portions of the supercritical storage tank 212. The supercritical storage tank 212 may elongate in a direction along which the first and second connection ports 216a and 216b are arranged to face each other.

The heater 214 may heat the process fluid stored in the supercritical storage tank 212. In an embodiment, the heater 214 may be provided in the form of a shape embedded in the supercritical storage tank 212. For example, the heater 214 may be embedded within a wall of the supercritical storage tank 212 or attached to an inner wall of the supercritical storage tank 212. The heater 214 may include, for example, a first embedded heater 214a, which is embedded in the wall of the supercritical storage tank 212, and/or a second embedded heater 214b, which is attached to the inner wall (e.g., a floor wall) of the supercritical storage tank 212 and which extends inward of the supercritical storage tank 212. The second embedded heater 214b may be provided in the form of a shape elongated along a longitudinal direction of the supercritical storage tank 212. In this configuration, the second embedded heater 214b and the process fluid may have therebetween a contact area to increase heat exchange efficiency. Embodiments of the present inventive concepts, however, are not limited thereto. In some embodiments, the heater 214 may be attached to an outer wall of the supercritical storage tank 212.

The heater 214 may operate such that the process fluid (e.g., the source fluid) received in the supercritical storage tank 212 may be heated to reach its critical temperature. The source fluid may be expanded to increase its pressure when being heated by the heater 214. The pump (see 340 of FIG. 1) connected to the source line 324 may increase an inner pressure of the supercritical storage tank 212. The source fluid may be expanded by being heated, so that the inner pressure of the supercritical storage tank 212 may not reach a critical pressure. In some embodiments, the pump 340 may operate such that the inner pressure of the supercritical storage tank 212 may be increased to the critical pressure.

For example, the supercritical storage tank 212 may be provided and filled through the source line 324 with the source fluid at or above its critical pressure, and the heater 214 may heat the source fluid to be at or above its critical temperature. Accordingly, the supercritical storage tank 212 may store the first to third supercritical fluids 210_1, 210_2, and 210_3, or the process fluid in the supercritical state. A temperature and pressure of the supercritical storage tank 212 may be detected by the detection sensor 218 including a temperature sensor 218a and a pressure sensor 218b, and thereby the supercritical storage tank 212 may maintain the supercritical state.

A third connection port 216c may be optionally provided to the supercritical storage tank 212. The third connection port 216c may be connected with a vent line 223. The process fluid may be discharged through the vent line 223 from the supercritical storage tank 212. The vent line 223 may be configured to selectively be in an open state or a close state. The vent line 223 may also be configured to adjust its open states opening degree or amount to control a quantity of the process fluid discharged through the vent line 223. For example, the vent line 223 may be installed thereon with a safety valve, and when the inner pressure of the supercritical storage tank 212 exceeds an allowable pressure, the safety valve may operate to automatically decrease the inner pressure of the supercritical storage tank 212.

Figure 6:
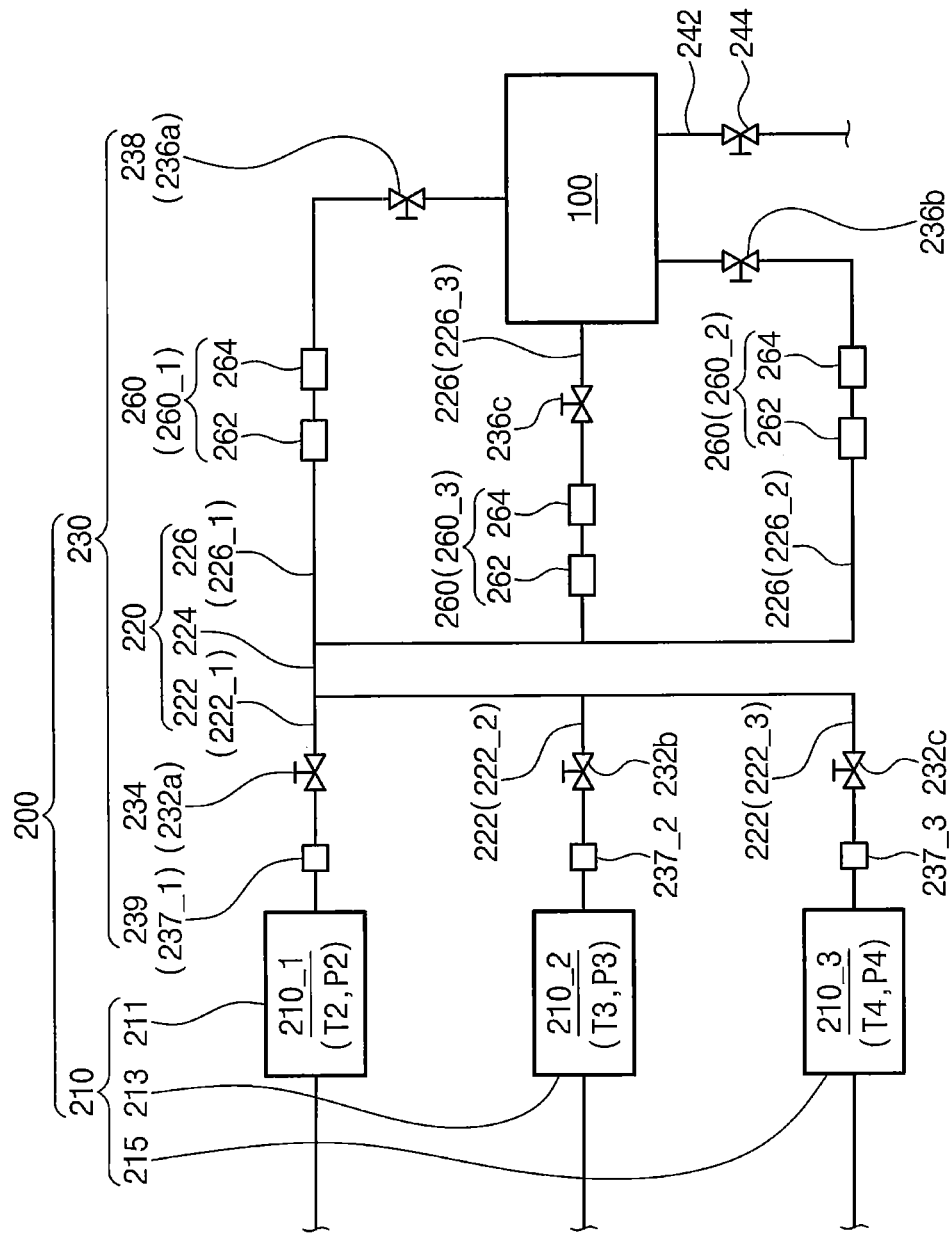
FIGS. 6 to 8 illustrate schematic diagrams showing a substrate drying apparatus according to some embodiments of the present inventive concepts.
Figure 7:
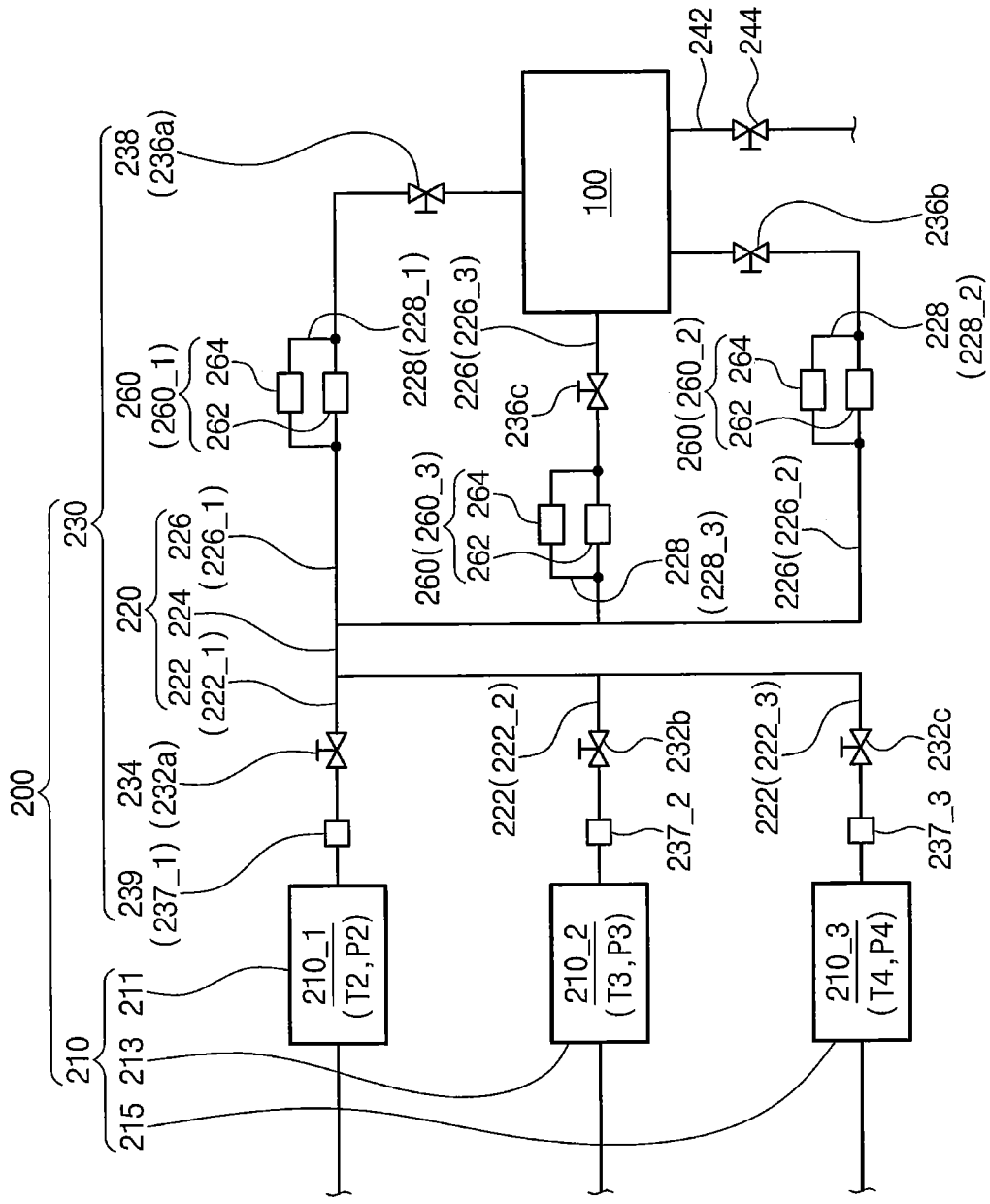
Figure 8:
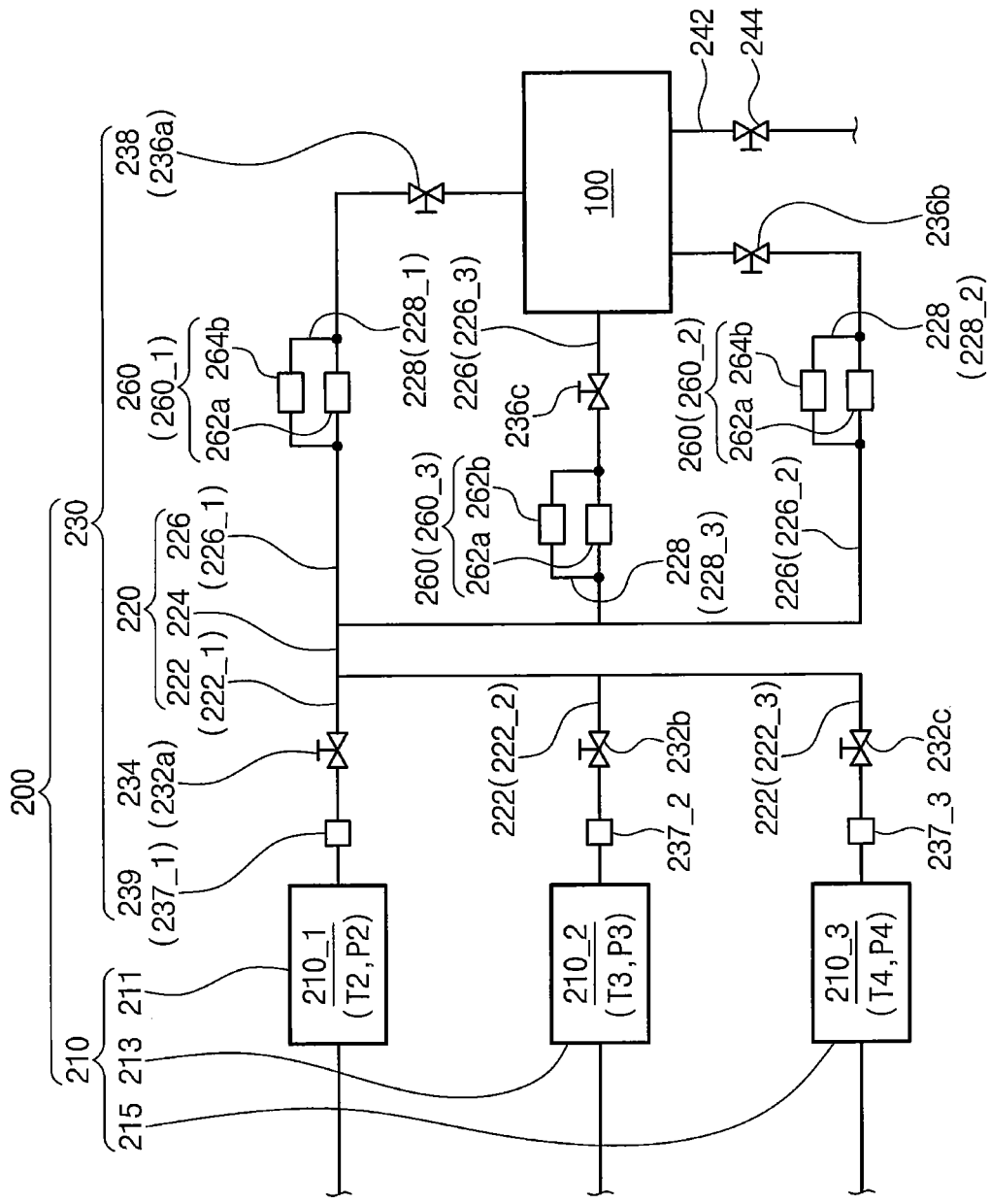

FIGS. 6 to 8 are schematic diagrams showing the supercritical fluid supply member 230 of the supercritical fluid supply unit 200 shown in FIG. 1.

Referring to FIGS. 6 to 8, the supercritical fluid supply member 230 may include a temperature control device 260. A process chamber 100, supercritical fluid reservoirs 210, front control valves 234, rear control valves 238, filters 239, an exhaust line 242, and/or an exhaust valve 244 may be configured substantially similar to those discussed with reference to FIG. 1. For brevity of description, a repetitive explanation will be omitted.

The temperature control device 260 may be engaged with a third rear supply line 226_3. The temperature control device 260 may include first, second, and third temperature control devices 260_1, 260_2, and 260_3. The first, second, and third temperature control devices 260_1, 260_2, and 260_3 may be respectively connected to first, second, and third rear supply lines 226_1, 226_2, and 226_3. The first to third temperature control devices 260_1, 260_2, and 260_3 may control temperatures of the first to third supercritical fluids 210_1, 210_2, and 210_3. Each of the first to third temperature control devices 260_1 to 260_3 may include a heating device 262 and a cooling device 264. For example, the heating device 262 may be provided as an in-line heater and/or an adsorption column, and the cooling device 264 may be provided as a cooler in which a cooling water is used as a refrigerant. Optionally, one of the heating and cooling devices 262 and 264 may not be provided to each of the first to third temperature control devices 260_1 to 260_3.

Referring to FIG. 6, the heating and cooling devices 262 and 264 of each of the first to third temperature control devices 260_1, 260_2, and 260_3 may be connected in series to each other. For example, the first rear supply line 226_1 may be provided thereon with the serially-connected heating and cooling devices 262 and 264 of the first temperature control device 260_1, and the second rear supply line 226_2 may be provided thereon with the serially-connected heating and cooling devices 262 and 264 of the second temperature control device 260_2. Likewise, the third rear supply line 226_3 may be provided thereon with the serially-connected heating and cooling devices 262 and 264 of the third temperature control device 260_3. The serially-connected heating and cooling devices 262 and 264 may be selectively operated by a control unit (not shown).

The temperature control device 260 may effectively control temperatures of the first to third supercritical fluids 210_1, 210_2, and/or 210_3 introduced into the process chamber 100. Since the temperature control device 260 includes not only the heating device 262 but cooling device 264 as well, each of the first to third supercritical fluids 210_1, 210_2, and 210_3 may be controlled in its temperature decrease as well as its temperature increase. As described herein, the process chamber 100 may be effectively provided with the first to third supercritical fluids 210_1, 210_2, and/or 210_3 that satisfy desired characteristics.

According to some embodiments, the heating and cooling devices 262 and 264 of the temperature control device 260 may be connected in parallel to each other. Referring to FIG. 7, the supercritical fluid supply line 220 may further include branch lines 228 correspondingly connected in parallel to the rear supply lines 226. Between two connection joints between the rear supply line 226 and the branch line 228, the heating device 262 may be provided on one of the rear supply line 226 and the branch line 228, and the cooling device 264 may be provided on the other of the rear supply lines 226 and the branch line 228. In addition, between the two connection joints between the rear supply line 226 and the branch line 228, valves (not shown) may be correspondingly installed on the rear supply line 226 and the branch lines 228, and thus each of the first to third supercritical fluids 210_1, 210_2, and 210_3 may be selectively controlled to flow through either the rear supply line 226 or the branch line 228.

For example, a first branch line 228_1 may be connected in parallel to the first rear supply line 226_1, and the first rear supply line 226_1 and the first branch line 228_1 may be respectively provided thereon with the heating device 262 and/or the cooling device 264 of the first temperature control device 260_1, which may make a parallel connection between the heating device 262 and the cooling device 264 of the first temperature control device 260_1. A second branch line 228_2 may be connected in parallel to the second rear supply line 226_2, and the second rear supply line 226_2 and the second branch line 228_2 may be respectively provided thereon with the heating device 260 and the cooling device 264 of the second temperature control device 260_2, which may make a parallel connection between the heating device 262 and the cooling device 264 of the second temperature control device 260_2. A third branch line 228_3 may be connected in parallel to the third rear supply line 226_3, and the third rear supply line 226_3 and the third branch line 228_3 may be respectively provided thereon with the heating device 262 and the cooling device 264 of the third temperature control device 260_3, which may make a parallel connection between the heating device 262 and the cooling device 264 of the third temperature control device 260_3.

In some embodiments, as illustrated in FIG. 8, each of the first to third temperature control devices 260_1, 260_2, and 260_3 may include a plurality of heating devices 262a and 262b connected in parallel to each other. For example, the first temperature control device 260_1 may include a first heating device 262a and a second heating device 262b respectively provided on the first rear supply line 226_1 and the first branch line 228_1, which may make a parallel connection between the first heating device 262a and the second heating device 262b of the first temperature control device 260_1. The second temperature control device 260_2 may include a first heating device 262a and a second heating device 262b respectively provided on the second rear supply line 226_2 and the second branch line 228_2, which may make a parallel connection between the first heating device 262a and the second heating device 262b of the second temperature control device 260_2. The third temperature control device 260_3 may include a first heating device 262a and a second heating device 262b respectively provided on the third rear supply line 226_3 and the third branch line 228_3, which may make a parallel connection between the first heating device 262a and the second heating device 262b of the third temperature control device 260_3. The first and second heating devices 262a and 262b may have preset temperatures different from each other.

Figure 9:
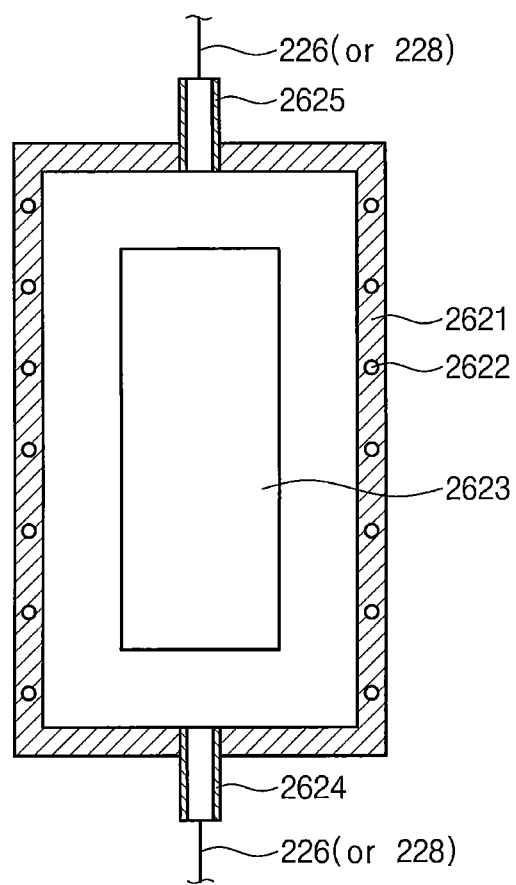
FIG. 9 is a schematic diagram showing the heating device of FIGS. 6 to 8.
Figure 10A:
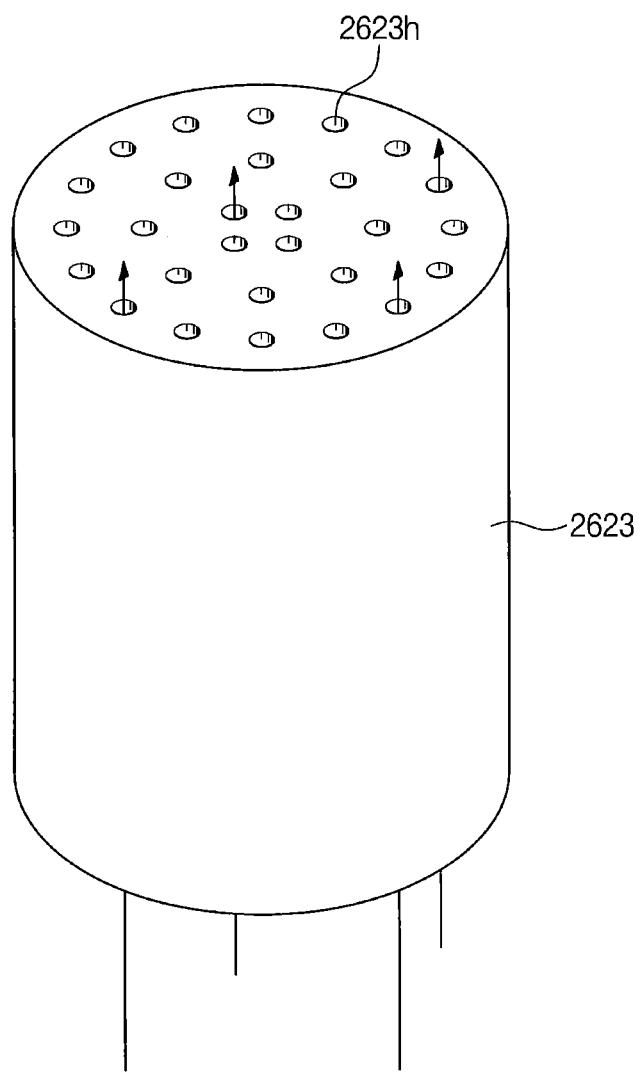
FIGS. 10A to 10C illustrate perspective views showing the heat exchange member of FIG. 9.
Figure 10B:
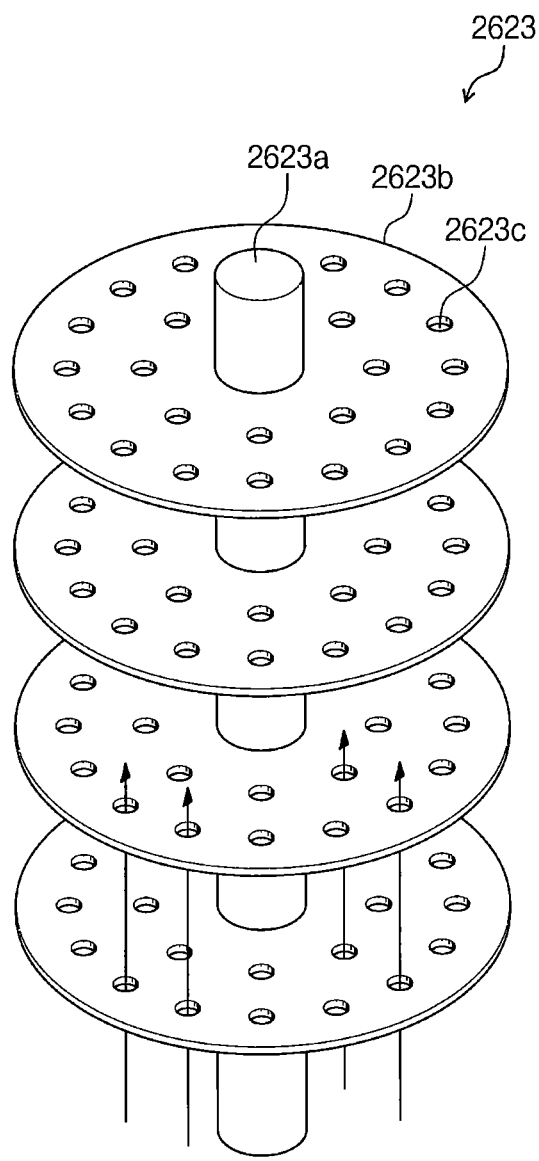
Figure 10C:
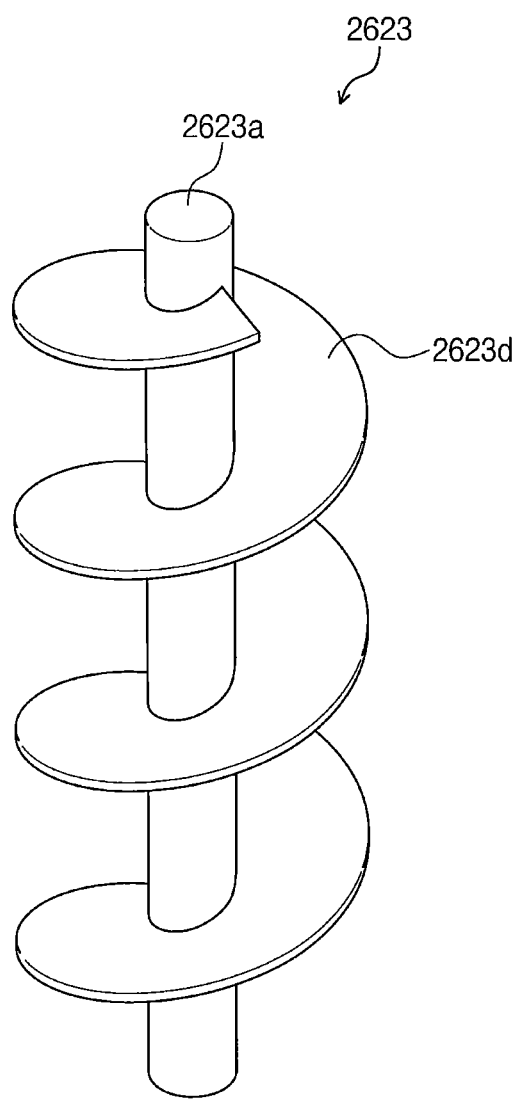

FIG. 9 illustrates a schematic diagram showing the heating device FIGS. 6 to 8. FIGS. 10A to 10C illustrate perspective views showing a heat exchange member of FIG. 9.

Referring to FIG. 9, the heating device 262 may be provided as an in-line heater. For example, the heating device 262 may include a body 2621, a heating source 2622, and a heat exchange member 2623.

The body 2621 may include an inlet 2624 and an outlet 2625, and may be provided in the form of a vessel that includes therein a flow passage through which the first to third supercritical fluids 210_1, 210_2, and 210_3 flow. The body 2621 may elongate in a direction along which the inlet 2624 and the outlet 2625 are arranged to face each other. Each of the inlet 2624 and the outlet 2625 may be coupled either with the rear supply line 226 or with the branch line 228.

The heating source 2622 may heat the first to third supercritical fluids 210_1, 210_2, and 210_3 flowing inside the body 2621. For example, the heating source 2622 may be provided embedded in a lateral sidewall of the body 2621, but the present inventive concepts are not limited thereto. Differently from that shown in figures, the heating source 2622 may be provided attached to an inner wall of the body 2621.

The heat exchange member 2623 may be provided in an inner space of the body 2621. The heat exchange member 2623 may be fixed to the inner wall of the body 2621 or may be positioned spaced apart from the inner wall of the body 2621. The heat exchange member 2623 may have a shape corresponding to that of the inner space of the body 2621. For example, the heat exchange member 2623 may elongate in a longitudinal direction of the body 2621. The heat exchange member 2623 may consist of metal having a high thermal conductivity. In addition or alternatively, the heat exchange member 2623 may consist of metal having a high corrosion proof to the process fluid in the supercritical state. When a contact area is increased between a thermal source and the first to third supercritical fluids 210_1, 210_2, and 210_3 that flow inside the body 2621 through the heat exchange member 2623, or when the first to third supercritical fluids 210_1, 210_2, and 210_3 turbulently flow inside the body 2621, a thermal diffusion coefficient may be increased between the thermal source and the supercritical fluid. Consequently, the heating device 262 may increase in heat exchange efficiency. The heat exchange member 2623, including its detailed shape, will be hereinafter described in detail with reference to FIGS. 10A to 10C.

Referring to FIG. 10A, the heat exchange member 2623 may be provided in the form of a cylindrical shape including a plurality of apertures 2623h. The apertures 2623h may provide the first to third supercritical fluids 210_1, 210_2, and 210_3 with their passages to enhance fluidity of the first to third supercritical fluids 210_1, 210_2, and 210_3. Optionally, no apertures 2623h may be provided.

Referring to FIG. 10B, the heat exchange member 2623 may include a first heat exchange member 2623a and/or a second heat exchange member 2623b. The first heat exchange member 2623a may be provided in the form of a rod. For example, the first heat exchange member 2623a may be provided in the form of a circular pillar or a polygonal pillar. The first heat exchange member 2623a may be fixed on the inner wall of the body 2621. The second heat exchange member 2623b may be fixed on an outer surface of the first heat exchange member 2623a. The second heat exchange member 2623b may be provided in the form of a plate shape including a plurality of apertures 2623c. For example, the second heat exchange member 2623b may be provided in the form of a circular plate or a polygonal plate. The second heat exchange member 2623b may be provided in plural spaced apart from each other in a longitudinal direction of the first heat exchange member 2623a.

Referring to FIG. 10C, a third heat exchange member 2623d may be provided in the form of a helical shape on the outer surface of the first heat exchange member 2623a. The first to third supercritical fluids 210_1, 210_2, and 210_3 may helically flow along the third heat exchange member 2623d. The first to third supercritical fluids 210_1, 210_2, and 210_3 may then flow in a turbulent fashion inside the body 2621.

Figure 11:
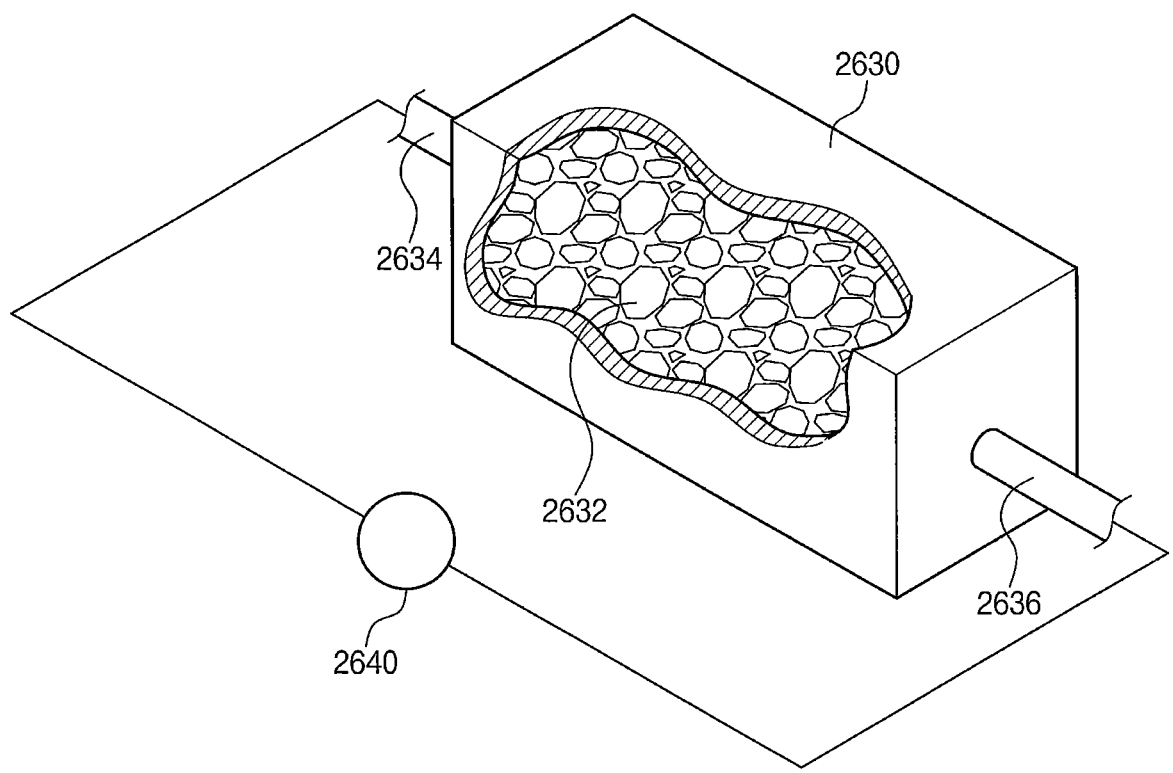
FIG. 11 illustrates a perspective view showing the heating device of FIGS. 6 to 8.
Figure 12:
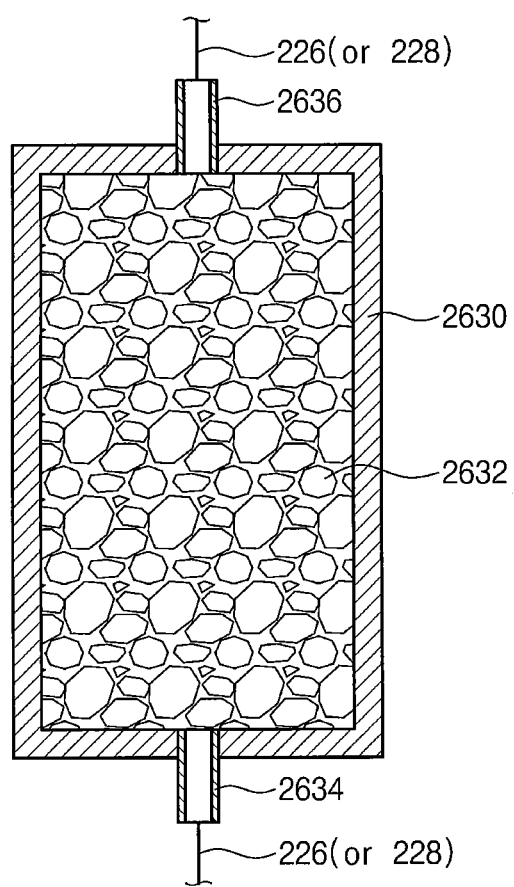
FIGS. 12 and 13 illustrate cross-sectional views showing the heating device of FIG. 11.
Figure 13:
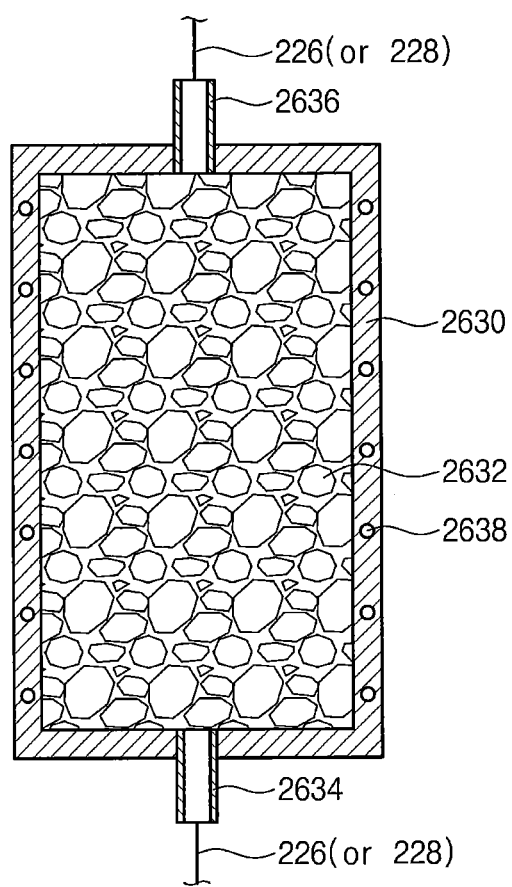

FIG. 11 illustrates a perspective view showing the heating device FIGS. 6 to 8. FIGS. 12 and 13 illustrate cross-sectional views showing the heating device of FIG. 11.

Referring to FIGS. 11 and 12, the heating device 262 may be provided as an adsorption column. For example, the heating device 262 may include a body 2630, an adsorbent 2632, and a temperature sensor 2640.

The body 2630 may be provided in the form of a vessel shape that accommodates the absorbent 2632 and provides flow passages of the first to third supercritical fluids 210_1, 210_2, and 210_3. For example, the body 2630 may have a hollow rectangular hexahedron, but the present inventive concepts are not limited thereto. The body 2630 may have an inflow line 2634 and an outflow line 2636 at its opposite ends in a longitudinal direction of the body 2630. The inflow line 2634 and/or the outflow line 2636 may be coupled either with the rear supply line 226 or with the branch line 228.

The adsorbent 2632 may be provided inside the body 2630. The adsorbent 2632 may include a material that enables to take up or adsorb impurities contained in the first to third supercritical fluids 210_1, 210_2, and 210_3. For example, the adsorbent 2632 may include zeolite or ceramic such as aluminosilicate. The adsorbent 2632 may take up impurities of the first to third supercritical fluids 210_1, 210_2, and 210_3 introduced through the inflow line 2634 into the body 2630. The taking up procedure (or, an adsorption procedure) may be an exothermic procedure, and the adsorption procedure may result in a heat generation to heat the first to third supercritical fluids 210_1, 210_2, and 210_3 that flow inside the body 2630.

The temperature sensor 2640 may detect temperatures of the first to third supercritical fluids 210_1, 210_2, and 210_3 that flow inside the body 2630. The temperature sensor 2640 may be engaged either with the inflow line 2634 or with the outflow line 2636, but the present inventive concepts are not limited thereto. For example, the temperature sensor 2640 may detect a temperature difference between the first to third supercritical fluids 210_1, 210_2, and 210_3 that flow into the body 2630 and the first to third supercritical fluids 210_1, 210_2, and 210_3 that flow out of the body 2630. Accordingly, while it is monitored whether or not the supercritical fluid satisfies a required temperature condition, it may be possible to determine whether or not the adsorbent 2632 should be replaced using the temperature difference of the first to third supercritical fluids 210_1, 210_2, and 210_3 that flow in and out. When the heating device 262 is provided in the form of an adsorption column, the supercritical fluid may increase in purity and/or may be controlled in temperature.

According to other embodiments, as illustrated in FIG. 13, the heating device 262 may further include an additional heating member 2638. The additional heating member 2638 may heat the first to third supercritical fluids 210_1, 210_2, and 210_3 that flow inside the body 2630. The additional heating member 2638 may be provided as a heater that receives an external power to generate heat. For example, the additional heating member 2638 may be provided embedded in a lateral sidewall of the body 2630, but the present inventive concepts are not limited thereto. The additional heating member 2638 may contribute to controlling temperatures of the supercritical fluids 210_1, 210_2, and 210_3.

Figure 14:
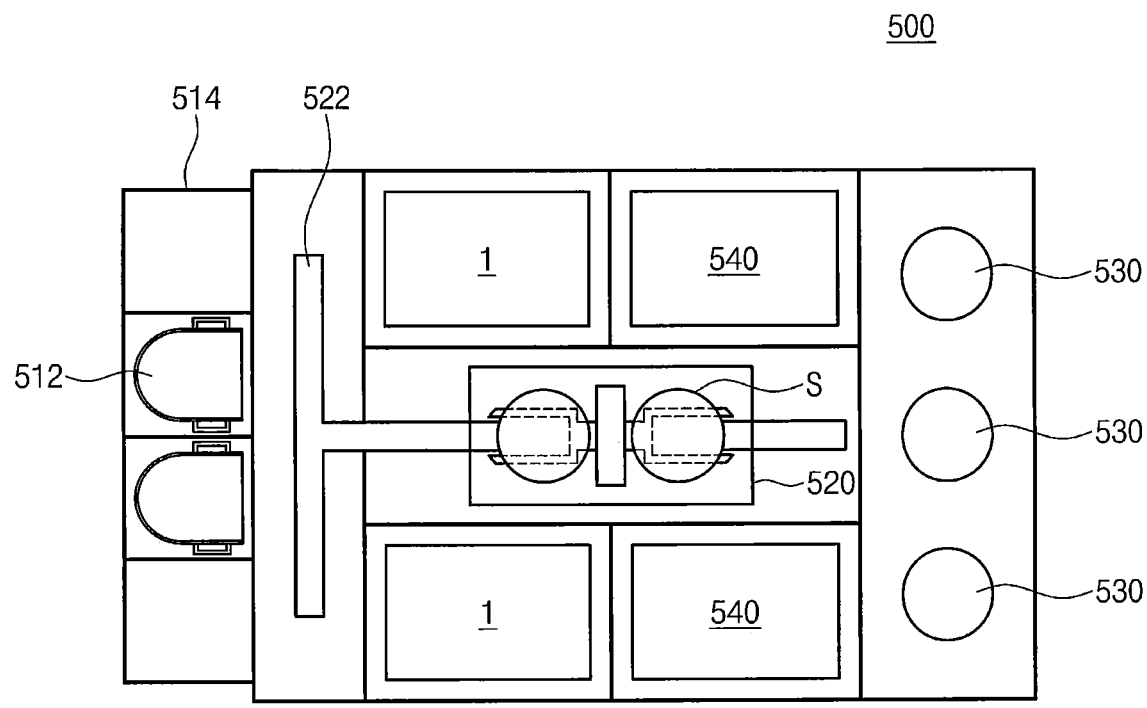
FIG. 14 is a schematic diagram showing a facility of manufacturing a semiconductor device including a substrate drying apparatus according to some embodiments of the present inventive concepts.

It will be hereinafter described a semiconductor manufacturing facility including the substrate drying apparatus discussed above. FIG. 14 is a schematic diagram showing a facility of manufacturing a semiconductor device comprising a substrate drying apparatus according to some embodiments of the present inventive concepts.

Referring to FIG. 14, a facility 500 of manufacturing a semiconductor device may include a wet process system. For example, the manufacturing facility 500 may include a substrate transfer apparatus 520, substrate polishing apparatuses 530, substrate cleaning apparatuses 540, and/or substrate drying apparatuses 1.

The substrate transfer apparatus 520 may move along a guide rail 522 to transfer substrates S to the substrate polishing apparatuses 530, the substrate cleaning apparatuses 540, and the substrate drying apparatuses 1. The substrate transfer apparatus 520 may load/unload the substrate S on/from carriers 512 on load ports 514. The load ports 514 may be disposed on an edge of the guide rail 522.

The substrate polishing apparatuses 530 may be disposed on an edge of the guide rail 522 which is opposite to an edge that facing the load ports 514. When the substrate polishing apparatus 530 receives the substrate S transferred from the carrier 512, the substrate polishing apparatus 530 may use a slurry (not shown) to polish the substrate S. The substrate S may then be planarized.

The substrate cleaning apparatuses 540 may be disposed between the substrate polishing apparatuses 530 and the substrate drying apparatuses 1. The substrate cleaning apparatus 540 may use a cleaning solution to clean slurry on the substrate S. The cleaning solution may include chemicals, deionized water, or an organic solvent (e.g., methyl alcohol or isopropyl alcohol).

The substrate drying apparatuses 1 may be disposed close to the load ports 514. The substrate drying apparatus 1 may dry the cleaning solution on the substrate S. The substrate drying apparatus 1 may use the first to third supercritical fluids 210_1, 210_2, and 210_3 to clean the substrate S, thereby preventing a watermark on the substrate S and/or a pattern collapse. The present inventive concepts, however, are not limited thereto. The substrate drying apparatus 1 may correspond to the substrate drying apparatus 1 discussed with reference to FIGS. 1 to 13.

The substrate cleaning apparatus 540 will be discussed hereinafter below.

Figure 15:
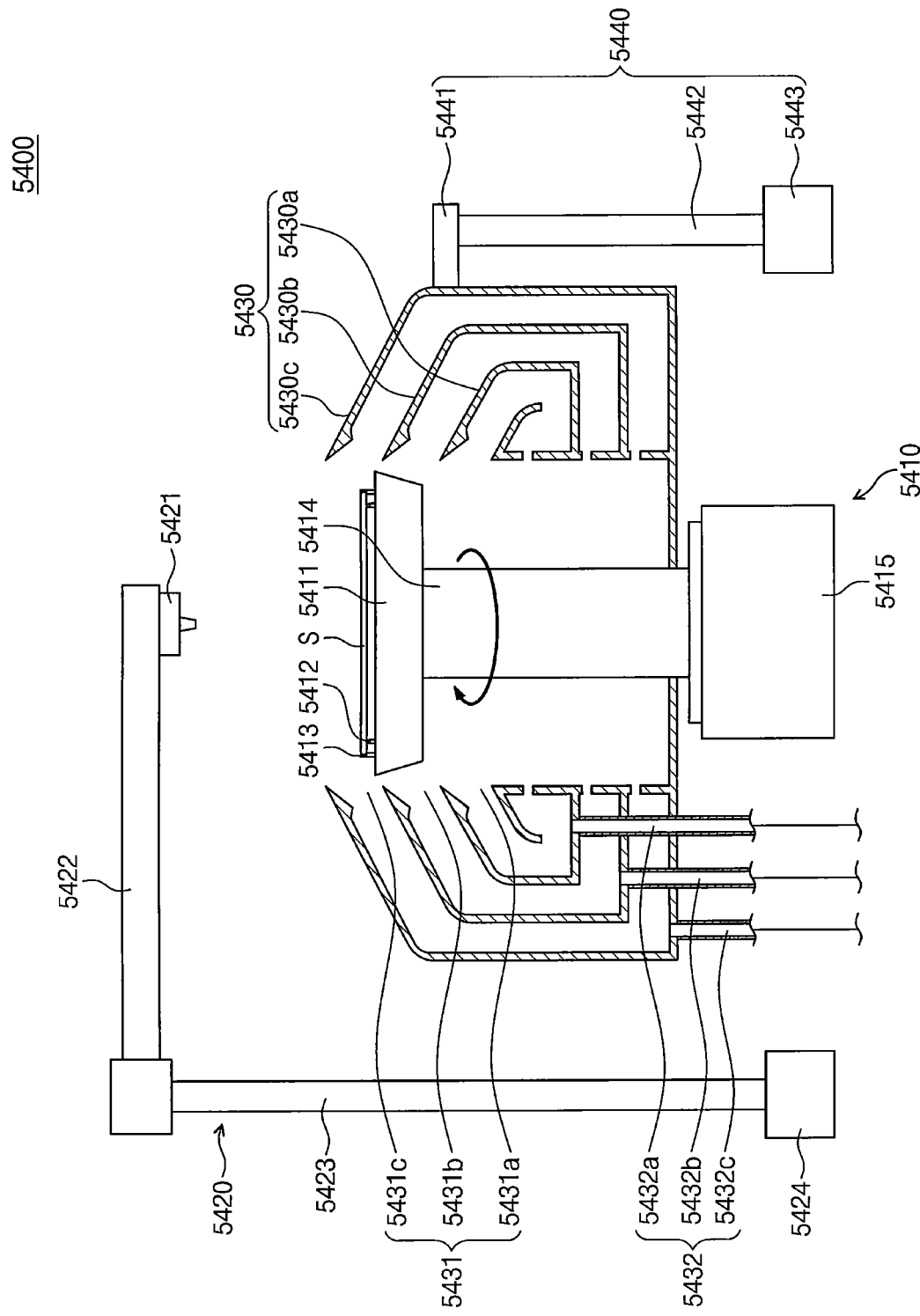
FIG. 15 illustrates a cross-sectional view showing the substrate cleaning apparatus of FIG. 14.

FIG. 15 is a cross-sectional view showing the substrate cleaning apparatus 540 of FIG. 14.

Referring to FIGS. 14 and 15, the substrate cleaning apparatus 540 may include a housing and/or a process unit 5400.

The housing may form outer walls of the substrate drying apparatus 1 and the substrate polishing apparatus 530, and may be provided therein with the process unit 5400 in which a cleaning process is performed. The process unit 5400 may include a spin head 5410, a fluid supply member 5420, a collect vessel 5430, and an elevation member 5440.

The spin head 5410 may place the substrate S thereon, and may rotate the substrate S during the time when a process is performed. The spin head 5410 may include a support plate 5411, a support pin 5412, a chucking pin 5413, a rotation shaft 5414, and/or a motor 5415.

The support plate 5411 may have an upper portion whose shape (e.g., circle or disc) is similar to that of the substrate S. The support plate 5411 may be provided on its upper portion with a plurality of support pins 5412 on which the substrate S is placed and with a plurality of chucking pins 5413 by which the substrate S is fixed. The support plate 5411 may be fixed at its bottom surface to the rotation shaft 5414 that rotates driven by the motor 5415. The motor 5415 may use an external power source to generate a rotational force to rotate the support plate 5411 through the rotation shaft 5414. Accordingly, when the substrate S is placed on the spin head 5410, the substrate S may rotate driven by rotation of the support plate 5411 during the time when the first process is performed.

The support pin 5412 may protrude in a direction perpendicular to a top surface of the support plate 5411, and a plurality of the support pins 5412 may be spaced apart from each other at a predetermined spacing. When viewed from the top, an arrangement of the support pins 5412 may constitute a circular ring shape as a whole. A bottom surface of the substrate S may be seated on the support pin 5412. Thus, the support pin 5412 may support the substrate S such that the substrate S may be spaced apart from the top surface of the support plate 5411 at a spacing corresponding to a protruding length of the support pin 5412.

The chucking pin 5413 may further protrude in a direction perpendicular to the top surface of the support plate 5411 than the support pin 5412, and may be disposed farther away from a center of the support plate 5411 than the support pin 5412. The chucking pins 5413 may shift along a radius direction of the support plate 5411 between a hold position and a pick-up position. The hold position may be spaced apart at a distance corresponding to a radius of the substrate S from the center of the support plate 5411, and the pick-up position may be spaced further apart from the center of the support plate 5411 than the hold position. When the substrate transfer apparatus 520 loads the substrate S on the spin head 5410, the chucking pin 5413 may move to the pick-up position. When a process is performed on the loaded substrate S, the chucking pin 5413 may move to the hold position to place the substrate S firmly in its normal position while the chucking pin 5413 comes into contact with a side surface of the substrate S. When the process is terminated and the substrate transfer apparatus 520 picks up and unloads the substrate S from the spin head 5410, the chucking pin 5413 may move back to the pick-up position. Therefore, the chucking pin 5413 may prevent the substrate S from being offset from its correct position by a rotational force caused by rotation of the spin head 5410.

The fluid supply member 5420 may include a nozzle 5421, a support frame 5422, a support shaft 5423, and a driving mechanism 5424. The fluid supply member 5420 may supply a fluid onto the substrate S.

The support shaft 5423 may longitudinally extend in a vertical direction, and the driving mechanism 5424 may be associated with a bottom end of the support shaft 5423. The driving mechanism 5424 may drive the support shaft 5423 to pivotally rotate or vertically move. The support frame 5422 may be perpendicularly coupled to an upper portion of the support shaft 5423. The nozzle 5421 may be installed on a bottom side of one end of the support frame 5422. The nozzle 5421 may move between a process position and a standby position by elevation and pivotal rotation of the support shaft 5423 driven by the driving mechanism 5424. The process position may be a position where the nozzle 5421 is placed vertically above the support plate 5411, and the standby position may be a position where the nozzle 5421 is placed offset from the support plate 5411.

The process unit 5400 may be provided with one or a plurality of fluid supply members 5420. When the fluid supply member 5420 is provided in plural, the plurality of fluid supply members 5420 may supply different fluids from each other. For example, ones of the plurality of fluid supply members 5420 may supply a cleaning agent, a rinsing agent, or an organic solvent. The cleaning agent may include hydrogen peroxide ($H_2O_2$), hydrofluoric acid (HF), or hydrogen peroxide ($H_2O_2$) mixed with ammonia ($NH_4OH$), hydrochloric acid (HCl), or sulfuric acid ($H_2SO_4$); the rinsing agent may include deionized water; and the organic solvent may include isopropyl alcohol (IPA). The organic solvent may include ethyl glycol, 1-propanol, tetra hydraulic furan, 4-hydroxyl, 4-methyl, 2-pentanone, 1-butanol, 2-butanol, methanol, ethanol, n-propyl alcohol, dimethylether, etc. For example, a first fluid supply member may spray an ammonia-hydrogen peroxide solution, a second fluid supply member may spray deionized water, and a third fluid supply member may spray an isopropyl alcohol solution.

The fluid supply member 5420 may move to the process position from the standby position when the substrate S is placed on the spin head 5410, and may then supply the substrate S with the fluid mentioned above. For example, the chemical process, the cleaning process, and the first drying process may be respectively performed when the fluid supply member 5420 supplies the cleaning agent, the rinsing agent, and the organic solvent. During the time when the processes are performed, the fluids may be uniformly provided onto a top surface of the substrate S on the spin head 5410 that is rotating when driven by the motor 5415.

The collect vessel 5430 may provide a collection space for use when the first process is performed, and may collect fluid used in the first process. The collect vessel 5430 may be disposed to surround the spin head 5410 and may have an opened upper portion, when viewed from the top. The process unit 5400 may be provided with one or a plurality of collect vessels 5430. It will be hereinafter described an example in which the process unit 5400 has three collect vessels 5430, or a first collect vessel 5430a, a second collect vessel 5430b, and a third collect vessel 5430c. The number of the collect vessels 5430 may be differently selected based on the number of fluids and conditions of the first process.

Each of the first to third collect vessels 5430a to 5430c may be provided in the form of a circular ring shape that surrounds the spin head 5410. The first, second, and third collect vessels 5430a, 5430b, and 5430c may be disposed gradually away from a center of the spin head 5410 in the foregoing sequence. The first collect vessel 5430a may surround the spin head 5410, the second collect vessel 5430b may surround the first collect vessel 5430a, and the third collect vessel 5430c may surround the second collect vessel 5430b. The first collect vessel 5430a may be provided with a first receiving entrance 5431a of its inner space. The second collect vessel 5430b may be provided with a second receiving entrance 5431b of a space defined between the first and second collect vessels 5430*a* and 5430*b*. The third collect vessel 5430*c* may be provided with a third receiving entrance 5431*c* of a space defined between the second and third collect vessels 5430*b* and 5430*c*. Each of the collect vessels 5430*a*, 5430*b*, and 5430*c* may be associated at its bottom side with a collect line 5432. The fluid collected in each of the collect vessels 5430*a*, 5430*b*, and 5430*c* may be drained through respective ones of collect lines 5432*a*, 5432*b*, and 5432*c*, and may then be supplied into a fluid recycling system (not shown). The fluid recycling system (not shown) may recycle the collected fluid into reusable fluid.

The elevation member 5440 may include a bracket 5441, an elevation shaft 5442, and an elevation mechanism. The elevation member 5440 may drive the collect vessel 5430 to move in a vertical direction. A relative height of the collect vessel 5430 with respect to the spin head 5410 may be changed to allow one receiving entrance 5431 of the collect vessel 5430 to place in position on a horizontal plane of the substrate S on the spin head 5410. The bracket 5441 may be installed on the collect vessel 5430, and may have an end coupled to the elevation shaft 5442 that vertically moves driven by the elevation mechanism 5443. When the collect vessel 5430 is provided in plural, the bracket 5441 may be engaged with an outermost one of the plurality of collect vessels 5430. When the substrate S is loaded on or unloaded from the spin head 5410, the elevation member 5440 may drive the collect vessel 5430 to move downward lest the collect vessel 5430 should interfere with a movement path of the substrate transfer apparatus 520 that transfers the substrate S.

During the time when the first process is performed while the fluid supply member 5420 supplies the fluid and the spin head 5410 rotates, the elevation member 5440 may drive such that the collect vessel 5430 may vertically move to place its receiving entrance 5431 to the same position as that of the horizontal plane of the substrate S, thereby collecting the fluid that escapes from the substrate S due to the centrifugal force produced by rotation of the substrate S. For example, when the first process is performed in such a way that the chemical process is executed using the cleaning agent, then the cleaning process is executed using the rinse agent, and thereafter the first drying process is executed using the organic solvent, the first to third receiving entrances 5431*a* to 5431*c* may sequentially move to the horizontal plane of the substrate S when the cleaning agent, the rinsing agent, and the organic solvent are sequentially supplied. This may allow the first to third collect vessels 5430*a* to 5430*c* to collect corresponding fluids. When the used fluid is collected, the environment may be protected from pollution, and/or expensive fluids may be recycled to save semiconductor manufacturing costs.

The elevation member 5440 may be configured to vertically move the spin head 5410, instead of moving the collect vessel 5430.

Figure 16:
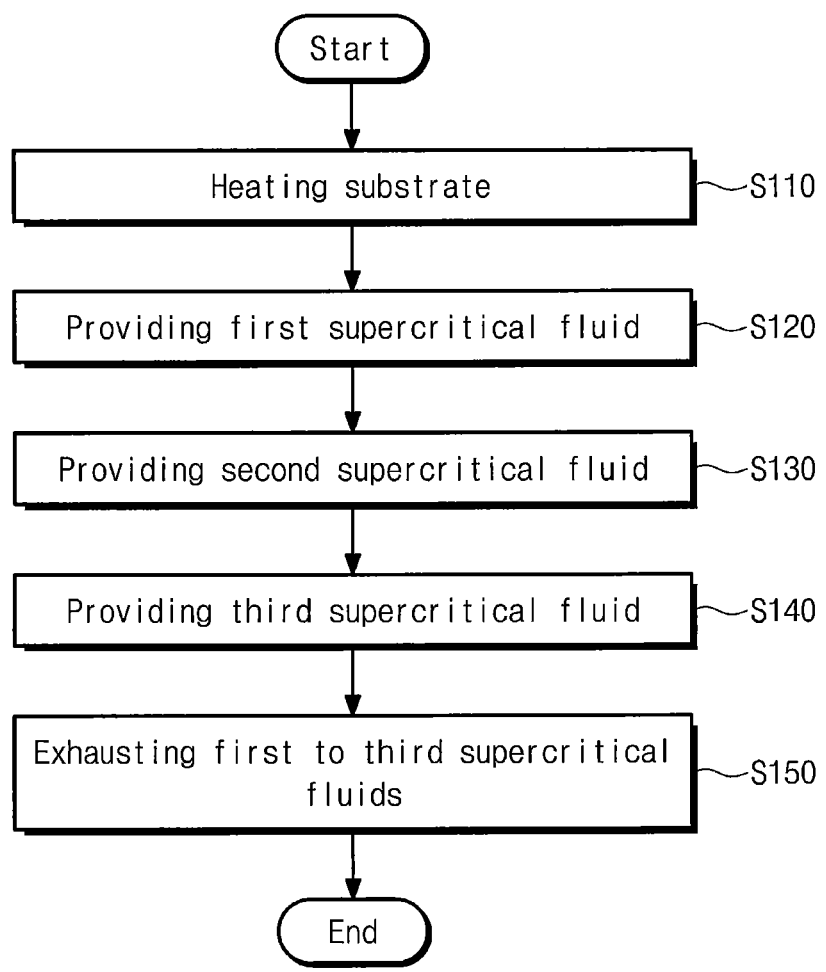
FIG. 16 is a flow chart showing a method of drying a substrate according to some embodiments of the present inventive concepts.

It will be hereinafter described a substrate drying method using the substrate drying apparatus discussed above. FIG. 16 illustrates a flow chart showing a substrate drying method using a substrate drying apparatus according to exemplary embodiments of the present inventive concepts. In some embodiments described herein, there is disclosed an example of substrate treatment procedure in which a supercritical drying process is performed on a substrate that has experienced a wet cleaning process. The present inventive concepts may be utilized in various substrate treatment processes such as a cleaning process on a substrate that has experienced an etching process.

Referring to FIGS. 1 to 13 and 16, when the substrate S is provided into the process chamber 100, the process chamber 100 may heat the substrate S to the first temperature T1 (S110). For example, the substrate S may have experienced a wet process, such as an etching or cleaning process, in the process chamber 100 in which a wet etching process is performed in accordance with operations of a semiconductor manufacturing method, and may include thereon fine pattern structures having a high aspect ratio of about 10 to about 50. The fine pattern structures may be formed to have a high aspect ratio by an etching process performed on multiple layers formed on a semiconductor substrate such as a wafer, and cleaning and rinsing processes may be performed to remove etching residues and byproducts. For example, the substrate S including thereon the fine pattern structures with a high aspect ratio may be cleaned by deionized water, BOE (Buffered Oxide Etchant), ammonium hydroxide, hydrogen oxide, and may then be rinsed by isopropyl alcohol or an organic solvent to which the first to third supercritical fluids 210_1, 210_2, and 210_3 are with high solubility. The process chamber 100 may heat the substrate S to the first temperature T1 of about 40° C. to about 80° C. less than an evaporation point of the isopropyl alcohol.

The supercritical fluid supply unit 200 may provide the first supercritical fluid 210_1 into the process chamber 100 (S120). The first supercritical fluid 210_1 may have the second temperature T2 less than the first temperature T1. The second temperature T2 may fall within a range from about 30° C. to about 39° C. (e.g. 31.1° C.). When the first supercritical fluid 210_1 is provided, the process chamber 100 may increase in pressure. For example, the first supercritical fluid 210_1 may be provided until the pressure of the process chamber 100 reaches a pressure corresponding to the critical point 217. The first supercritical fluid 210_1 may be provided into the process chamber 100 for about 20 seconds to about 30 seconds.

When the critical point 217 of the first supercritical fluid 210_1 is reached, the supercritical fluid supply unit 200 may provide the process chamber 100 with the second supercritical fluid 210_2 (S130). The critical point 217 of the first supercritical fluid 210_1 may be about 72 bar. The second supercritical fluid 210_2 may have the third temperature T3 greater than the first temperature T1. The third temperature T3 may fall within a range from about 100° C. to about 200° C. When the second supercritical fluid 210_2 is provided, the process chamber 100 may increase in pressure. For example, the pressure of the process chamber 100 may increase to the pressure associated with the saturation duration S214. A pressure of the saturation duration S214 may be a critical point of the second supercritical fluid 210_2. For example, the pressure of the saturation duration S214 may be about 150 bar. The second supercritical fluid 210_2 may be provided into the process chamber 100 for about 10 seconds to about 20 seconds. For example, when the process chamber 100 heats the first supercritical fluid 210_1 to about 100° C. or more, the first supercritical fluid 210_1 may produce a large quantity of particles to pollute the substrate S and/or the process chamber 100.

When the pressure of the process chamber 100 reaches the pressure associated with the saturation duration S214, the supercritical fluid supply unit 200 may provide the process chamber 100 with the third supercritical fluid 210_3 (S140). The third supercritical fluid 210_3 may be at a fourth temperature T4 that is the same as the first temperature T1. The fourth temperature T4 may fall within a range from about 40° C. to about 80° C. The third supercritical fluid 210_3 may dry an organic solvent on the substrate S. The third supercritical fluid 210_3 may be provided into the process chamber 100 for about 100 seconds.

When the pressure of the process chamber 100 has experienced the saturation duration S214, the first to third supercritical fluids 210_1, 210_2, and 210_3 may stop their supply and may then be drained through the exhaust line 242 (S150). The process chamber 100 may decrease in pressure. The first to third supercritical fluids 210_1, 210_2, and/or 210_3 may be drained for about 150 seconds. The first to third supercritical fluids 210_1, 210_2, and/or 210_3 may dry the substrate S without a watermark and/or pattern collapse.

According to some embodiments of the present inventive concepts, the substrate drying apparatus may provide the process chamber with the first supercritical fluid having the second temperature less than the first temperature to thereby reduce the substrate drying time, and may provide the process chamber with the second supercritical fluid having the third temperature greater than the critical point of the first supercritical fluid to thereby decrease particle generation.

Although the present invention has been described in connection with the embodiments of the present invention illustrated in the accompanying drawings, it will be understood to those skilled in the art that various changes and modifications may be made without departing from the technical spirit and essential feature of the present invention. It will be apparent to those skilled in the art that various substitution, modifications, and changes may be thereto without departing from the scope and spirit of the inventive concept.

What is claimed is:

1. A substrate drying apparatus, comprising:
a chamber configured to dry a substrate at a first temperature;
a first reservoir configured to store a first supercritical fluid having a second temperature that is less than the first temperature;
a second reservoir configured to store a second supercritical fluid having a third temperature that is greater than the first temperature;
a supply unit, connected between the chamber and the first reservoir and/or the second reservoir; and
a third reservoir configured to store a third supercritical fluid at the first temperature,
wherein the supply unit is configured to supply the first supercritical fluid and/or the second supercritical fluid into the chamber.

2. The apparatus of claim 1, wherein the supply unit is configured to sequentially supply the first and second supercritical fluids to increase a pressure in the chamber.

3. The apparatus of claim 2, wherein, when the pressure of the chamber reaches a critical point of the first supercritical fluid, the supply unit is configured to provide the chamber with the second supercritical fluid.

4. The apparatus of claim 3, wherein, when the second temperature is 31.1° C., the critical point is 72 bar.

5. The apparatus of claim 1, wherein the first temperature is in a range between 40° C. to 80° C.

6. The apparatus of claim 1, wherein, when the second supercritical fluid reaches a pressure associated with a saturation duration, the supply unit provides the chamber with the third supercritical fluid.

7. The apparatus of claim 6, wherein the pressure associated with the saturation duration is 150 bar.

8. The apparatus of claim 1, wherein the supply unit comprises:
supply lines connecting the chamber to the first reservoir and/or second reservoir;
valves engaged with corresponding ones of the supply lines and controlling corresponding supplies of the first supercritical fluid and/or second supercritical fluid; and
filters engaged with corresponding ones of the supply lines, wherein the filters are configured to filter pollutions in the first supercritical fluid and/or second supercritical fluid.

9. The apparatus of claim 8, wherein one of the filters comprises a metal sintering filter.

10. A facility for manufacturing a semiconductor device, comprising:
a substrate polishing apparatus that is configured to polish a substrate;
a substrate cleaning apparatus that is configured to clean the substrate; and
a substrate drying apparatus that is configured to dry the substrate,
wherein the substrate drying apparatus comprises:
a chamber that is configured to dry the substrate at a first temperature;
a first reservoir that is configured to store a first supercritical fluid at a second temperature that is less than the first temperature;
a second reservoir that is configured to store a second supercritical fluid at a third temperature that is greater than the first temperature;
a supply unit that is connected between the chamber and the first reservoir and/or the second reservoir; and
a third reservoir configured to store a third supercritical fluid at the first temperature,
wherein the supply unit is configured to provide the chamber with the first supercritical fluid and/or the second supercritical fluid.

11. The facility of claim 10, wherein the substrate cleaning apparatus uses isopropyl alcohol to rinse the substrate, wherein the first temperature is less than an evaporation temperature of the isopropyl alcohol.

12. The facility of claim 11, wherein the first temperature is in a range between 40° C. to 80° C.

13. The facility of claim 12, wherein the second temperature is in a range between 30° C. to 39° C.

14. The facility of claim 12, wherein the third temperature is in a range between 100° C. to 200° C.

15. A substrate treatment apparatus, comprising:
a process chamber comprising a space where at least one supercritical fluid of a plurality of supercritical fluids is used to treat a substrate; and
a supercritical fluid supply unit that is configured to supply the process chamber with the at least one supercritical fluid,
wherein the supercritical fluid supply unit comprises:
a plurality of supercritical fluid reservoirs that store respective ones of the plurality of supercritical fluids, wherein the plurality of supercritical fluids have different temperatures from each other; and
a supercritical fluid supply line that connects the process chamber to the plurality of supercritical fluid reservoirs,
wherein a first supercritical fluid reservoir of the plurality of supercritical fluid reservoirs comprises:
a supercritical storage tank comprising an embedded heater; and a detection sensor configured to detect an inner pressure and/or an inner temperature of the supercritical storage tank.

16. The substrate treatment apparatus of claim 15, wherein the embedded heater comprises:
   a first embedded heater embedded in a lateral sidewall of the supercritical storage tank; and
   a second embedded heater attached to an inner wall of the supercritical storage tank.

17. The substrate treatment apparatus of claim 15, wherein the supercritical fluid supply line comprises:
   a plurality of front supply lines connected to respective ones of the plurality of supercritical fluid reservoirs;
   a connection line commonly connected to each of the plurality of front supply lines; and
   a plurality of rear supply lines that are branched from the connection line and are each connected to the process chamber.

18. The substrate treatment apparatus of claim 17, wherein the supercritical fluid supply unit further comprises:
   a plurality of temperature control devices connected to respective ones of the plurality of rear supply lines,
   wherein each of the plurality of temperature control devices comprises one or more of a heating device and/or one or more of a cooling device.

* * * * *